US012704525B2

(12) United States Patent
Chen et al.

(10) Patent No.: US 12,704,525 B2
(45) Date of Patent: Aug. 11, 2026

(54) TESTING APPARATUS AND METHOD OF USING THE SAME

(71) Applicant: Taiwan Semiconductor Manufacturing Company, Ltd., Hsinchu (TW)

(72) Inventors: Jian-Ting Chen, Hsinchu County (TW); Cheng-Han Huang, Hsinchu (TW); Kuang-Hua Wang, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 202 days.

(21) Appl. No.: 18/754,177

(22) Filed: Jun. 26, 2024

(65) Prior Publication Data

US 2024/0345130 A1 Oct. 17, 2024

Related U.S. Application Data

(63) Continuation of application No. 18/316,211, filed on May 11, 2023, now Pat. No. 12,066,457, which is a (Continued)

(51) Int. Cl.
*G01R 1/04* (2006.01)
*G01R 1/02* (2006.01)
(Continued)

(52) U.S. Cl.
CPC ....... *G01R 1/0433* (2013.01); *H01R 12/7076* (2013.01)

(58) Field of Classification Search
CPC . G01R 1/02; G01R 1/04; G01R 1/067; G01R 1/073; G01R 1/20; G01R 31/02;
(Continued)

(56) References Cited

U.S. PATENT DOCUMENTS 5,481,436 A * 1/1996 Werther ................. H05K 1/141 439/75
6,727,579 B1 4/2004 Eldridge et al.
(Continued)

FOREIGN PATENT DOCUMENTS

CN 102881660 1/2013
CN 106449011 2/2017
(Continued)

OTHER PUBLICATIONS

"Notice of Allowance of China Counterpart Application", issued on Mar. 16, 2026, p. 1-p. 6.
(Continued)

*Primary Examiner* — Neel D Shah
(74) *Attorney, Agent, or Firm* — JCIPRNET

(57) ABSTRACT

A testing apparatus for a semiconductor package includes a circuit board, testing patterns and a socket. The circuit board has a testing region and includes a plurality of testing contacts and a plurality of signal contacts distributed in the testing region. The testing patterns are embedded in the circuit board and electrically connected to the testing contacts, where each of the testing patterns includes a first conductive line and a second conductive line including a main portion and a branch portion connected to main portion. The first conductive line is connected to the main portion. The socket is located on the circuit board and comprising connectors electrically connected to the circuit board, wherein the connectors are configured to transmit electric signals for testing the semiconductor package from the testing apparatus.

20 Claims, 18 Drawing Sheets

Related U.S. Application Data continuation of application No. 17/461,967, filed on Aug. 30, 2021, now Pat. No. 11,693,025.

(51) Int. Cl.

| | |
|---|---|
| ***G01R 1/067*** | (2006.01) |
| ***G01R 1/073*** | (2006.01) |
| ***G01R 31/02*** | (2006.01) |
| ***G01R 31/20*** | (2006.01) |
| ***G01R 31/26*** | (2020.01) |
| ***G01R 31/28*** | (2006.01) |
| ***H01R 12/70*** | (2011.01) |

(58) Field of Classification Search

CPC ........ G01R 31/20; G01R 31/26; G01R 31/28; H01R 12/7076

See application file for complete search history.

(56) References Cited

U.S. PATENT DOCUMENTS

| | | | | |
|---|---|---|---|---|
| 6,798,051 | B2 * | 9/2004 | Benedix | H05K 1/141 257/E25.011 |
| 2001/0023983 | A1 | 9/2001 | Kobayashi et al. | |
| 2005/0035754 | A1 * | 2/2005 | Ho | G01R 31/2896 324/756.05 |
| 2007/0290342 | A1 | 12/2007 | Ishikawa | |

FOREIGN PATENT DOCUMENTS

| | | |
|---|---|---|
| CN | 112164716 | 1/2021 |
| CN | 112530882 | 3/2021 |
| CN | 115497902 | 12/2022 |
| TW | 201816969 | 5/2018 |
| WO | 2017209356 | 12/2017 |

OTHER PUBLICATIONS

Ruying He, “Exploration of Protection Methods for Semiconductor Integrated Circuit Chips”, Industrial Property, Dec. 31, 1989, pp. 1-18.

Phil Garrou, “IFTLE 454: TSMC Exhibits Packaging Prowess at Virtual ECTC 2020”, 3D Incites, Jun. 30, 2020, available at: https://www.3dincites.com/2020/06/iftle-454-tsmc-exhibits-packaging-prowess-at-virtual-ectc-2020/.

* cited by examiner

TESTING APPARATUS AND METHOD OF USING THE SAME

CROSS-REFERENCE TO RELATED APPLICATION

This application is a continuation application of and claims the priority benefit of a prior application Ser. No. 18/316,211, filed on May 11, 2023. The prior application Ser. No. 18/316,211, is a continuation application of and claims the priority benefit of a prior application Ser. No. 17/461,967, filed on Aug. 30, 2021, now allowed. The entirety of each of the above-mentioned patent applications is hereby incorporated by reference herein and made a part of this specification.

BACKGROUND

Semiconductor devices and integrated circuits (ICs) are typically manufactured on a single semiconductor wafer. The dies of the wafer may be processed and packaged with other semiconductor devices or dies at the wafer level, and various technologies have been developed for the wafer level packaging. Semiconductor processing for fabrications of the semiconductor devices and ICs continues to evolve towards increasing device-density, higher numbers of active devices (mainly transistors) of ever decreasing device dimensions. As electronic products are continuously miniaturized, the warpage due to elevated temperatures have become an issue for packaging technology

BRIEF DESCRIPTION OF THE DRAWINGS

Aspects of the disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
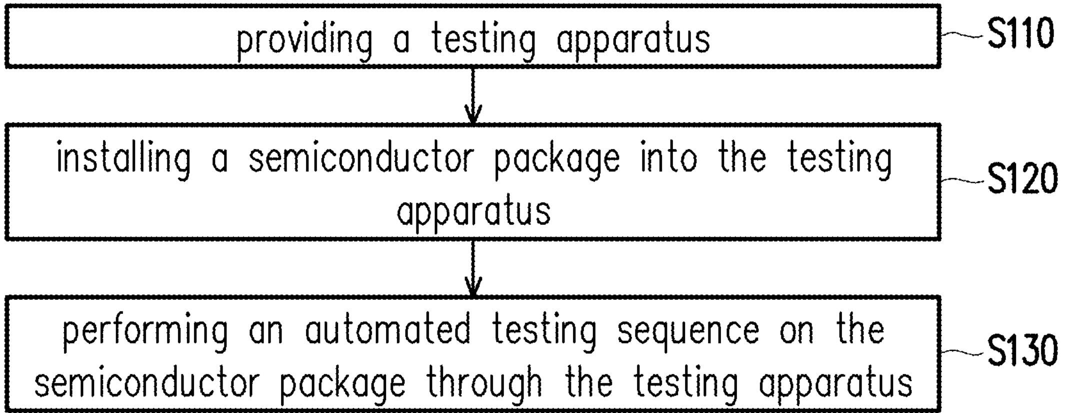
FIG. 1 illustrates a flowchart of a method for using a testing apparatus in accordance with some embodiments of the disclosure.

The following disclosure provides many different embodiments, or examples, for implementing different features of the provided subject matter. Specific examples of components, values, operations, materials, arrangements, or the like, are described below to simplify the disclosure. These are, of course, merely examples and are not intended to be limiting. Other components, values, operations, materials, arrangements, or the like, are contemplated. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the disclosure may repeat reference numerals and/or letters in the various examples. This repetition is for the purpose of simplicity and clarity and does not in itself dictate a relationship between the various embodiments and/or configurations discussed.

Further, spatially relative terms, such as “beneath,” “below,” “lower,” “above,” “upper” and the like, may be used herein for ease of description to describe one element or feature’s relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In addition, terms, such as “first”, “second”, “third”, “fourth” and the like, may be used herein for case of description to describe similar or different element(s) or feature(s) as illustrated in the figures, and may be used interchangeably depending on the order of the presence or the contexts of the description.

Figure 2:
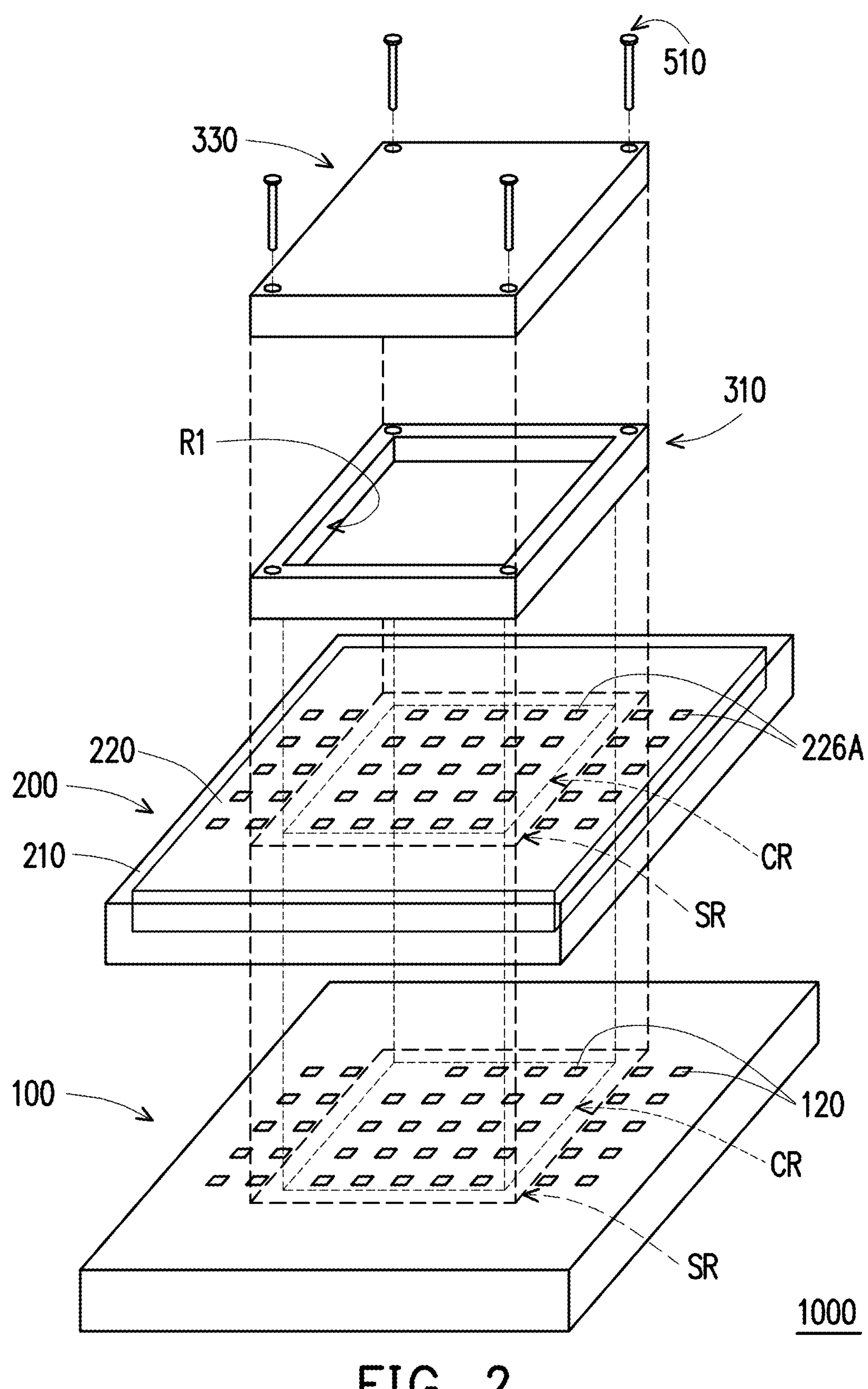
FIG. 2 is a schematic explosive view illustrating a testing apparatus in accordance with some embodiments of the disclosure.
Figure 3:
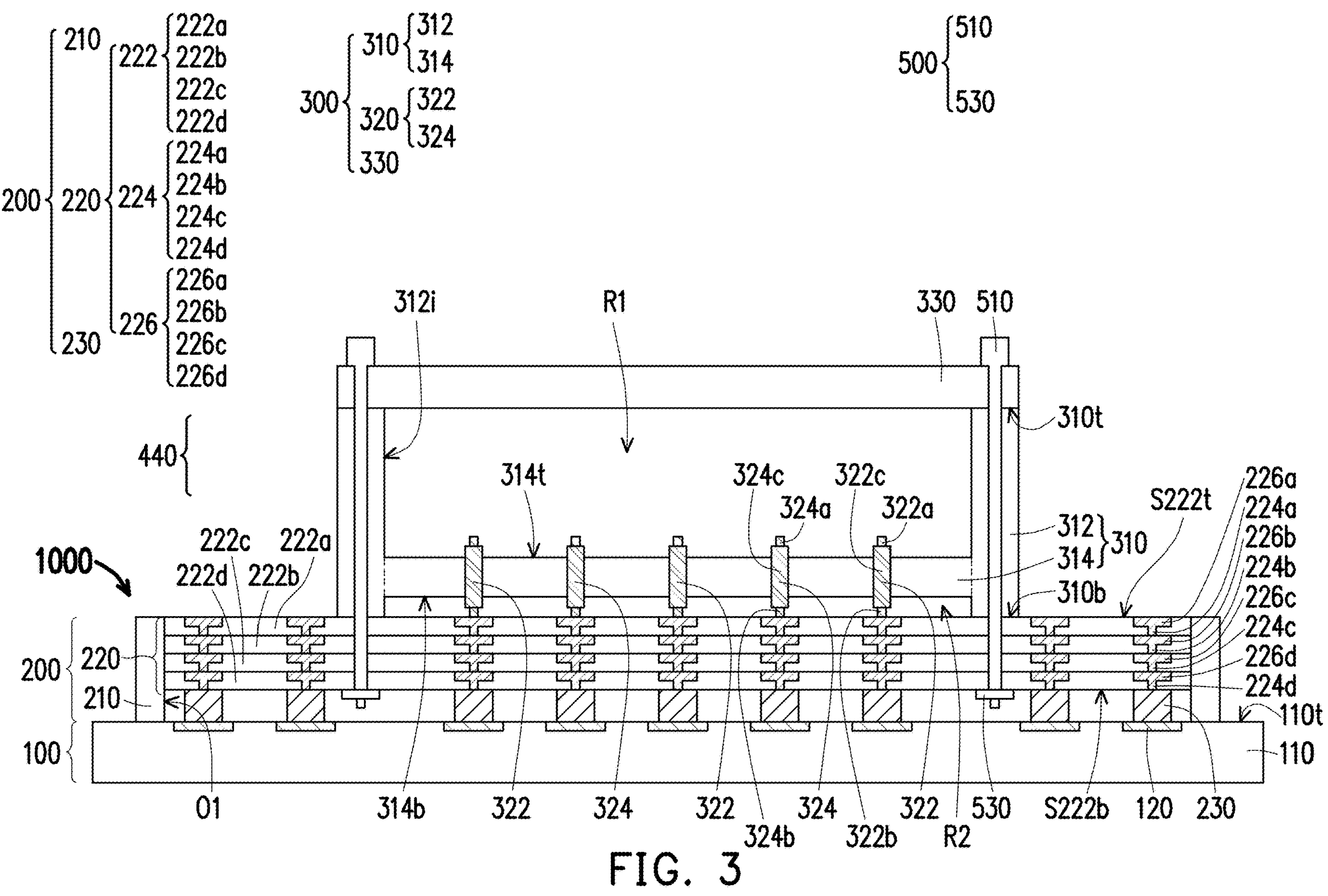
FIG. 3 is a schematic cross-sectional view of the testing apparatus depicted in FIG. 2.
Figure 4A:
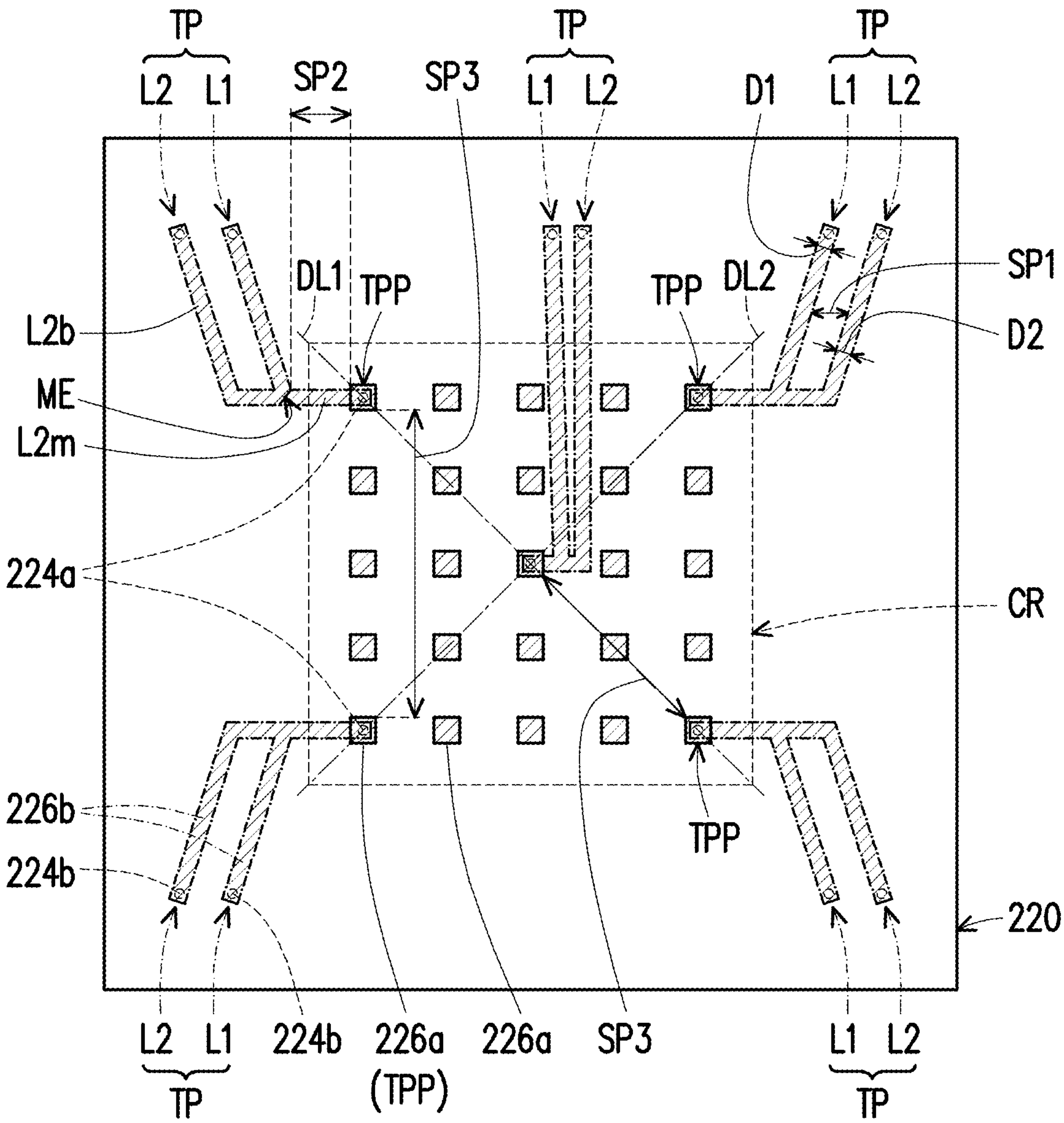
FIG. 4A is a schematic plane view illustrating a relative position of a portion of components of a circuit board structure included in the testing apparatus depicted in FIG. 2.
Figure 4B:
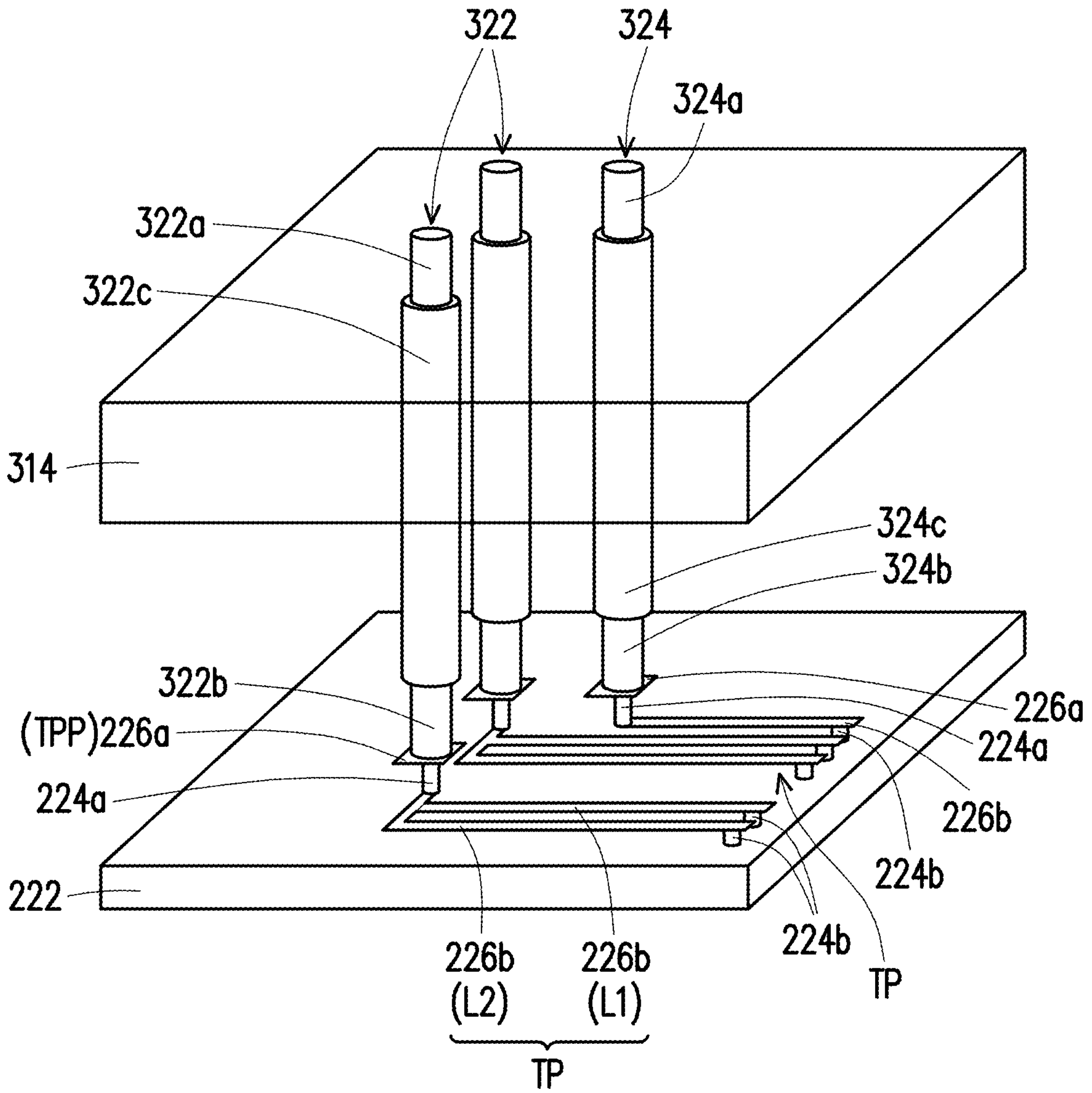
FIG. 4B is a schematic perspective view of the components indicated by a dashed box X depicted in FIG. 4A.

FIG. 1 illustrates a flowchart of a method for using a testing apparatus in accordance with some embodiments of the disclosure. FIG. 2 is a schematic explosive view illustrating a testing apparatus 1000 in accordance with some embodiments of the disclosure. FIG. 3 is a schematic cross-sectional view of the testing apparatus 1000 depicted in FIG. 2. FIG. 4A is a schematic plane view illustrating a relative position of a portion of components of a circuit board structure included in the testing apparatus 1000 depicted in FIG. 2, where FIG. 3 shows the cross-sectional view taken along a dotted line (DL1 or DL2) depicted in FIG. 4A. FIG. 4B is a schematic perspective view of the components indicated by a dashed box X depicted in FIG. 4A. Some components shown in FIG. 2 and FIG. 3 are omitted in FIG. 4A and FIG. 4B to show concise, schematic top view and perspective views. The embodiments are intended to provide further explanations, but are not used to limit the scope of the disclosure.

In some embodiments, a testing apparatus is provided, in accordance with step S110 of FIG. 1. For example, referring to FIG. 2, FIG. 3, and FIG. 4A, in some embodiments, a testing apparatus 1000 including a testing module 100, a circuit board structure 200, a socket 300, and a holding device 500. In some embodiments, the circuit board structure 200 is located on and electrically connected to the testing module 100, the socket 300 is located on and electrically connected to the circuit board structure 200, and the holding device 500 are penetrating through the circuit board structure 200 and the socket 300 so to lock the socket 300 onto the circuit board structure 200. The socket 300 may have an accommodating space (R1 depicted in FIG. 2 and FIG. 3) for an object to-be-tested or a device under test (denoted as DUT), such as a semiconductor package 400 (described later in FIG. 5 through FIG. 7).

In some embodiments, the testing module 100 includes a body 110, a plurality of conductive contacts 120 exposed from the body 110 (e.g., a surface 110*t* thereof) for external connection (e.g. to the circuit board structure 200), and a controller (not shown) embedded in the body 110 and electrically connected to the conductive contacts 120. For example, the body 110 is a body made of a material with a sufficient stiffness (which may be quantified by its Yong's modulus) to protecting the controller and the conductive contacts 120 formed therein, where the body 110 is electrically isolated from the controller and the conductive contacts 120. The material of the body 110 may include a dielectric material or a combination of dielectric material and conductive material (such as a metal or a metal alloy).

In some embodiments, as shown in FIG. 2 through FIG. 4A, the conductive contacts 120 are distributed over a surface 110*t* of the body 110. In one embodiment, the conductive contacts 120 are electrically isolated form on another, in part. In an alternative embodiment, the conductive contacts 120 are all electrically isolated form on another. A material of the conductive contacts 120 may include aluminum, titanium, copper, nickel, tungsten, and/or alloys thereof, and may be formed by electroplating or deposition. The disclosure is not limited thereto. The conductive contacts 120 may also be patterned by a photolithography and etching process. Throughout the description, the term "copper" is intended to include substantially pure elemental copper, copper containing unavoidable impurities, and copper alloys containing minor amounts of elements such as tantalum, indium, tin, zinc, manganese, chromium, titanium, germanium, strontium, platinum, magnesium, aluminum or zirconium, etc. The number of the conductive contacts 120 shown in FIG. 2 through FIG. 4A is for illustrative proposes only, and the disclosure is not limited thereto. The number of the conductive contacts 120 may be selected and designated based on the demand and design layout. Owing to the conductive contacts 120, an external connection to the controller embedded in the body 110 of the testing module 100 is available.

The controller may be with or without built-in memory devices (e.g., for storing testing settings or test results). The controller may include analog and digital circuits, a processor, or a combination thereof. The controller may be implemented by circuitry including, but not limited to, analog circuit, digital circuit, semiconductor integrated circuit such as at least one processor (e.g., a central processing unit (CPU)), at least one application specific integrated circuit (ASIC), and/or at least one field programmable gate array (FPGA), or a combination thereof. The at least one processor may be configured or programmed, by reading one or more instructions from at least one machine readable tangible medium, to perform the functions of the controller as described further below. For example, the controller may be one or more than one. In some embodiments, the testing module 100 includes an automatic (or automated) testing equipment (ATE), which performs measurements (by generating and sending testing electric signals (e.g., a current) and receiving responsive electric signals (e.g. a voltage)) and evaluates the test results (e.g., analysis of the responsive electric signals) for testing the integrated circuits and internal circuitries of the object to-be-tested DUT.

It is appreciated that, the object to-be-tested DUT has electrical characteristics (e.g., voltage or current characteristics) that are desired to be measured and/or tested at various positions, where the testing module 100 with the controller embedded therein facilitates efficient identification of failures in interconnects inside the object to-be-tested DUT and physical connections between the object to-be-tested DUT and the socket 300. In the disclosure, the status of the connections between the object to-be-tested DUT and the socket 300 indicates the status of a warpage of the object to-be-tested DUT, which will be described later in conjunction with FIGS. 5-7, 14A-14B, FIGS. 15A-15B and FIGS. 16A-16B.

In some embodiments, the circuit board structure 200 includes a holder 210, a circuit board 220 and a plurality of the connectors 230. For example, the circuit board 220 is located (housed) inside the holder 210, where the connectors 230 are located on and electrically connected to the circuit board 220 and located inside the holder 210. In some embodiments, the holder 210 is adopted to hold the circuit board 220 over the testing module 100 in a proper position. For example, the holder 210 may be a frame holder which surrounds the periphery of the circuit board 220 to maintain the position of the circuit board 220 over the testing module, as shown in FIG. 3. However, alternatively, the holder 210 may be a housing with various accommodating spaces for the circuit board 220 and the connectors 230. A material of the holder 210 may include stainless steel, polyester, polyimide, glass, epoxy, or the like. For example, the holder 210 is electrically isolated from the testing module 100 and the circuit board 220.

In some embodiments, the circuit board 220 is located on and electrically connected to the testing module 100 through the connectors 230 as shown in FIG. 3, where the connectors 230 are accommodated in a space O1 confined by the holder 210, the circuit board 220 and the testing module 100. In some embodiments, the circuit board 220 includes a plurality of build-up layers (not labeled) each including a metal trace 226 (e.g. 226*a*, 226*b*, 226*c*, or 226*d*), a metal via 224 (e.g. 224*a*, 224*b*, 224*c*, or 224*d*) connected to the metal trace 226, and a dielectric layer 222 (e.g. 222*a*, 222*b*, 222*c*, or 222*d*) surrounding the metal trace 226 and the metal via 224. The metal trace 226*a*, the metal via 224*a* and the dielectric layer 222*a* together constitute a first build-up layer; the metal trace 226*b*, the metal via 224*b* and the dielectric layer 222*b* together constitute a second build-up layer; the metal trace 226*c*, the metal via 224*c* and the dielectric layer 222*c* together constitute a third build-up layer; and, the metal trace 226*d*, the metal via 224*d* and the dielectric layer 222*d* together constitute a fourth build-up layer. For example, the metal via 224a connects the metal trace 226a overlying thereto and the metal trace 226b underlying thereto, and the metal traces 226a and 226b are electrically connected to each other. The metal via 224b connects the metal trace 226b overlying thereto and the metal trace 226c underlying thereto, and the metal traces 226b and 226c are electrically connected to each other. The metal via 224c connects the metal trace 226c overlying thereto and the metal trace 226d underlying thereto, and the metal traces 226c and 226d are electrically connected to each other. The metal via 224d connects the metal trace 226d overlying thereto and a respective one of the connectors 230 underlying thereto, and the metal trace 226d and the respective one connectors 230 are electrically connected to each other. That is, the electrical connection paths between the metal traces 226a and the metal vias 224d are established. Owing to such configuration, the metal traces 226 and the metal vias 224 together constitute a routing structure, thereby the circuit board 220 is capable of providing a routing function. Only four build-up layers are shown in the disclosure for illustrative proposes only, and the disclosure is not limited thereto. The number of the build-up layers may be selected and designated based on the demand and design layout. The number of the build-up layers may be more than 40 layers. Alternatively, the number of the build-up layers may be more than 70 layers. The disclosure is not limited thereto.

The material of the dielectric layers 222 may include polyimide, epoxy resin, acrylic resin, phenol resin, benzocyclobutene (BCB), polybenzoxazole (PBO), or any other suitable polymer-based dielectric material, and may be formed by deposition, lamination or spin-coating. The material of the metal vias 224 and the metal traces 226 may include aluminum, titanium, copper, nickel, tungsten, and/or alloys thereof, and may be formed by electroplating or deposition. The disclosure is not limited thereto. The dielectric structures dielectric layers 222, the metal vias 224 and the metal traces 226 independently may also be patterned by a photolithography and etching process. In one embodiment, one metal via 224 and a respective one metal traces 226 overlying thereto may be formed together by dual damascene process. In an alternative embodiment, one metal via 224 and a respective one metal traces 226 overlying thereto may be formed by single damascene process, separately.

In some embodiments, the connectors 230 are distributed over a surface S222b of the circuit board 220 and within the space O1. A material of the connectors 230 may include aluminum, titanium, copper, nickel, tungsten, and/or alloys thereof, and may be formed by electroplating or deposition. The disclosure is not limited thereto. The connectors 230 may also be patterned by a photolithography and etching process. The number of the connectors 230 shown in FIG. 3 is for illustrative proposes only, and the disclosure is not limited thereto. The number of the connectors 230 may be selected and designated based on the demand and design layout. Owing to the connectors 230, the circuit board 220 (e.g. the metal traces 246) is electrically connected to the testing module 100. In some embodiments, the positions of the connectors 230 are corresponding to the positions of the conductive contacts 120 for proper electrical connections therebetween.

In other words, the electric signals generated from the testing module 100 may be rerouted to the sockets 300 through the circuit board structure 200 for the object to-be-tested DUT, and/or the receiving responsive electric feed-backed from the object to-be-tested DUT may be rerouted to the sockets 300 through the circuit board structure 200 for the testing module 100 for further processing. In certain embodiments, the circuit board 220 serves as a loadboard for the testing module 100, where a variety of electrical components/devices (such as integrated circuits, resistors, capacitors, inductors, relays, etc.) are employed to make up the loadboard's test circuit. However, the disclosure is not limited thereto, in alternative embodiments, the circuit board 220 serves as a loadboard for the testing module 100, which is free of additional electrical components/devices. The disclosure is not limited thereto.

As shown in FIGS. 4A-4B in conjunction with FIG. 3, for example, the circuit board 220 includes a plurality of testing patterns TP embedded therein, where each testing pattern TP is electrically connected to a respective one metal trace 226a for electrically connecting the testing pattern TP to the socket 300. In the disclosure, one metal trace 226a connecting to the testing pattern TP is referred to as one testing point TPP. For example, as shown in FIG. 4A and FIG. 4B in conjunction with FIGS. 17A-17B, the testing patterns TP independently includes a conductive line L1 and a conductive line L2, where the conductive line L2 includes a main portion L2m and a branch portion L2b, and the conductive line L1 is connected to the conductive line L2 at a merged edge (or portion) ME of the main portion L2m. In other words, the branch portion L2b of the conductive line L2 and the main portion L2m of the conductive line L2 are merged at the merged edge ME where the conductive line L1 connected to. In certain embodiments, the testing module 100 provides a current to the respective metal trace 226a connected to the testing pattern TP through the conductive line L1 while measures a voltage at the merged edge ME of the conductive line L2. In other words, there is no current passing through the branch portion L2b of the conductive line L2, and the current provided from the conductive line L1 is further provided to the socket 300 through the main portion L2m of the conductive line L2 to the object to-be-tested DUT. In some embodiments, the metal traces 226a connecting the testing patterns TP are referred to as testing contacts, and the metal trace 226a not connecting to the testing patterns TP are referred to as signal contacts.

In some embodiment, the status of each of the connections between the object to-be-tested DUT and the socket 300 is reflected by a resistance R at a contact point between the object to-be-tested DUT and the socket 300. For example, the contact point CP (in FIGS. 14B, 15B and 16B) is referred to a location where a conductive terminal (e.g. 452 in FIGS. 5-7, 14B, 15B and 16B) of the semiconductor package 400 is to be in contact with a connector (e.g. 322 in FIGS. 5-7, 14B, 15B and 16B) of the socket 300, where the connector (e.g. 322) is electrically connected to the testing point TPP electrically connecting to one testing pattern TP, as shown in FIG. 4A and FIG. 4B. In certain embodiments, a resistance R, at the contact point CP between the object to-be-tested DUT (e.g. the semiconductor package 400) and the socket 300, is calculated by Equation (I) as follows:

$$R = \frac{(V2 - V3) - (V1 - V4)}{(I2) - (I1)}. \quad \text{Equation (I)}$$

In Equation (I), if the resistance R is less than or equal to 10.0 ohm (Ω), the status of a connection between the object to-be-tested DUT and the socket 300 is considered as a good contact. On the other hand, if the resistance R reaches the maxima of a resistance that can be measured by the testing module 100, the status of a connection between the object to-be-tested DUT and the socket 300 is considered as no contact, e.g., an open circuit. For example, if a maximum value of a resistance can be measured by the testing module 100 is 1.0 kΩ and there is no contact between the object to-be-tested DUT and the socket 300 at the contact point, the resistance R at the contact point (between the object to-be-tested DUT and the socket 300) will be 1.0 kΩ. Furthermore, if the resistance R is greater than 10.0 ohm (Ω) and less than the maximum value of a resistance measured by the testing module 100, the status of a connection between the object to-be-tested DUT and the socket 300 is considered as a bad contact or oxidation (e.g. the terminal of the semiconductor package 400 is oxidized).

With above, the connections between the object to-be-tested DUT and the socket 300 can be easily determined. Therefore, the warpage of the object to-be-tested DUT is determined by using multiple testing points TPP each connecting to one testing pattern TP and each disturbed in different locations in a chip region CR on the circuit board 220. The chip region CR may be corresponding to a position location of the objected to-be-tested DUT accommodated in the socket 300. For example, the chip region CR may be referred to as a testing region. In some embodiments, in a top view as shown in FIG. 4A, the shape of the chip region CR is a square. Alternatively, in the top view, the shape of the chip region CR may be a rectangle or a circle. If considering the shape of the chip region CR is a circle, the chip region CR should be located at the center of the socket 300, diagonal lines or central lines used for locating the testing points may be diagonal lines or central lines of the socket 300, instead; however, the disclosure is not limited thereto.

In some embodiments, at least, the metal traces 226*a* within the chip region CR are arranged in the form of a matrix, such as the N×N array or N×M array (N, M>0, N may or may not be equal to M) on the a surface S222*t* of the circuit board 220 (facing towards the socket 300) for electrically connected to the connectors of the socket 300. The surface S222*t* of the circuit board 220 is opposite to the surface S222*b* of the circuit board 220 along a stacking direction of the testing module 100 and the circuit board structure 200, for example. For example, some of the metal traces 226*a* within the chip region CR are used as the testing points TPP, while the rest of the metal traces 226*a* within the chip region CR are used as conductive contacts for other electric signal transmission.

The testing points TPP may include at least three testing points TPP, where the testing points TPP may be arranged on the circuit board 220 at different locations positioning on the diagonal lines DL1, DL2 of the chip region CR, where there is one testing points TPP being arranged at the center (e.g. an intersection of the diagonal lines DL1 and DL2) of the chip region CR. In some embodiments, as shown in FIG. 4A, there are five testing points TPP, where one testing point TPP is located at the center of the chip region CR, the rest of the testing points TPP are located at different location along the diagonal lines DL1 and DL2. For example, the rest of the testing points TPP are located at the corners of the chip region CR passing through the diagonal lines DL1 and DL2, as shown in FIG. 4.

Figure 8:
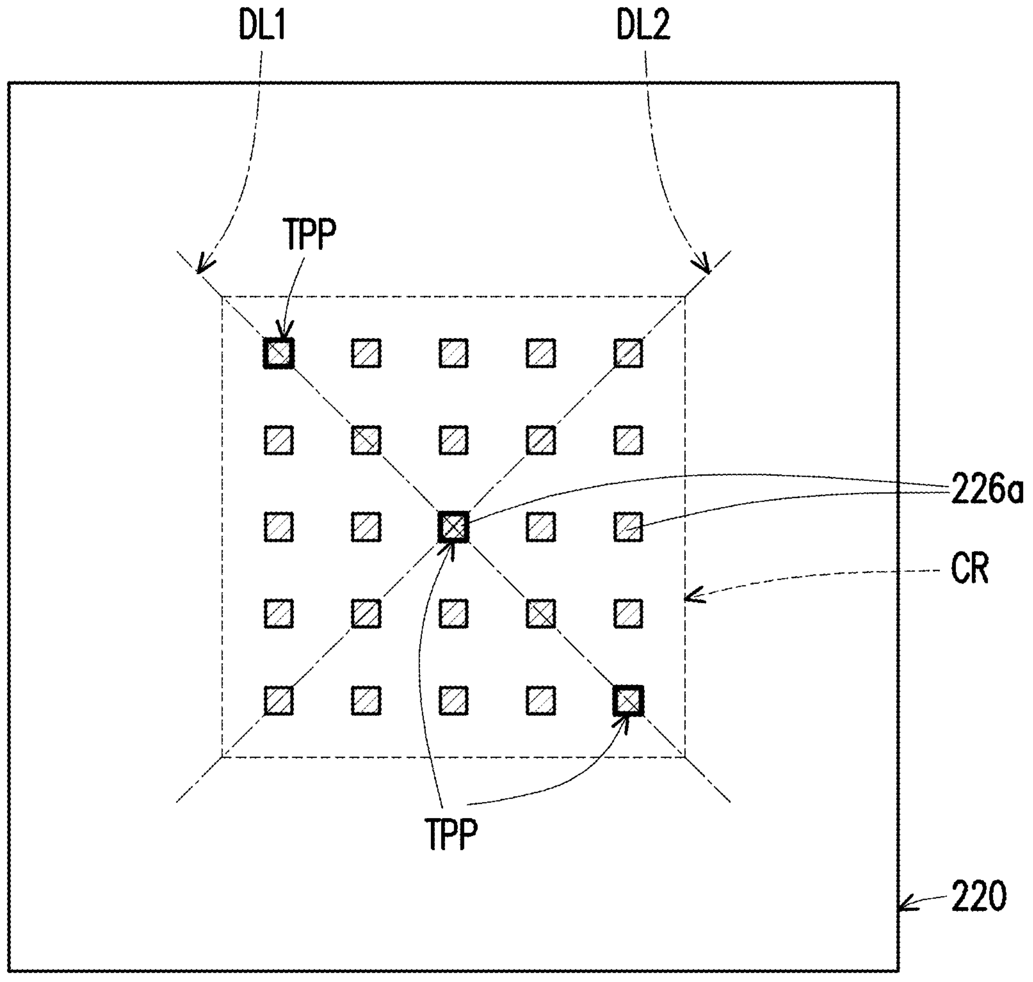
FIG. 8 through FIG. 13 are schematic enlarged top views illustrating various arrangement of testing channels and testing points of a circuit board structure included an assembly in accordance with some embodiments of the disclosure, respectively.
Figure 9:
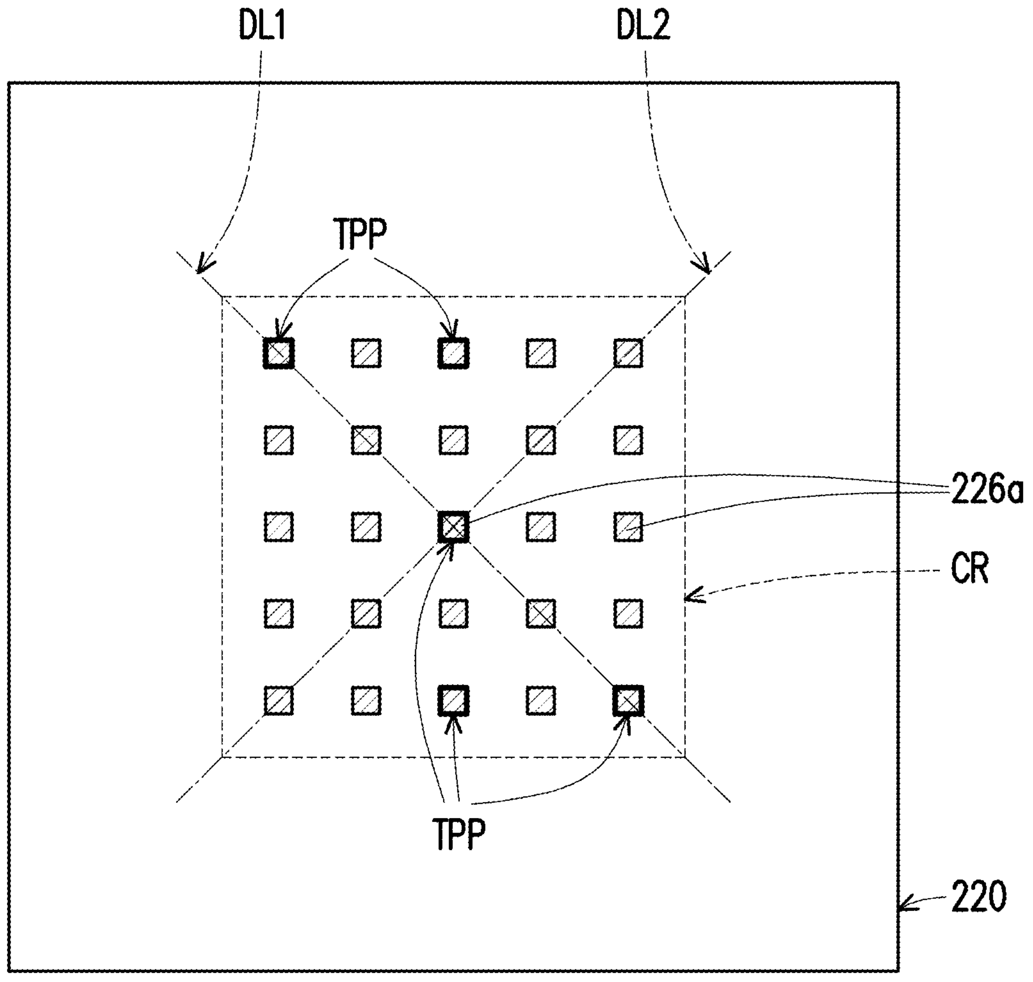
Figure 10:
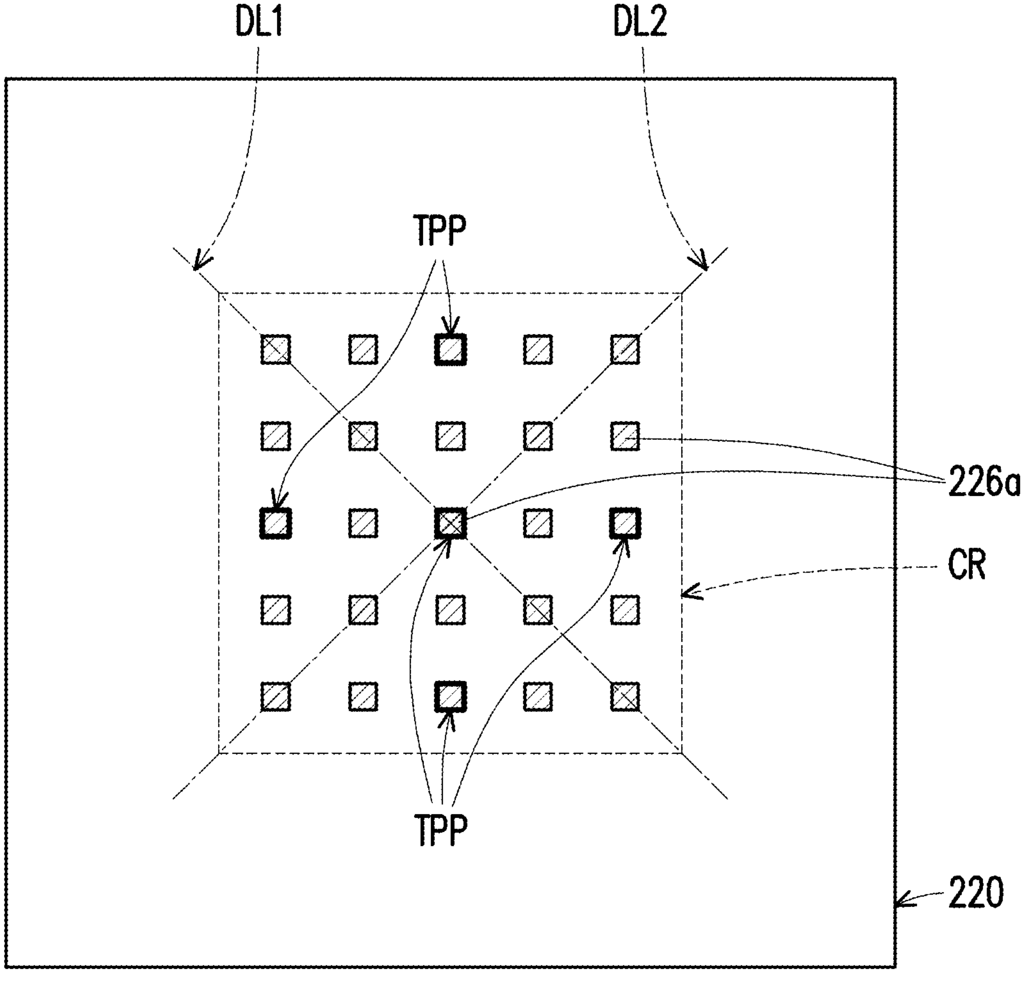

However, the disclosure is not limited thereto. The testing points TPP may include three testing points TPP, where one testing point TPP may be located at the center of the chip region CR, and the other two testing points TPP may be located on one diagonal line (e.g. DL1) at two different sides of the center of the chip region CR, as shown in FIG. 8. On the other hand, the testing points TPP may include five testing points TPP, where one testing point TPP may be located at the center of the chip region CR, two testing points TPP may be located on one diagonal line (e.g. DL1) at two different sides of the center of the chip region CR, and other two testing points TPP are randomly arranged over the chip region CR, as shown in FIG. 9. Furthermore, the testing points TPP may include five testing points TPP, where one testing point TPP may be located at the center of the chip region CR, and the rest of the testing points TPP are randomly arranged over the chip region CR surrounding the center of the chip region CR, as shown in FIG. 10.

Figure 11:
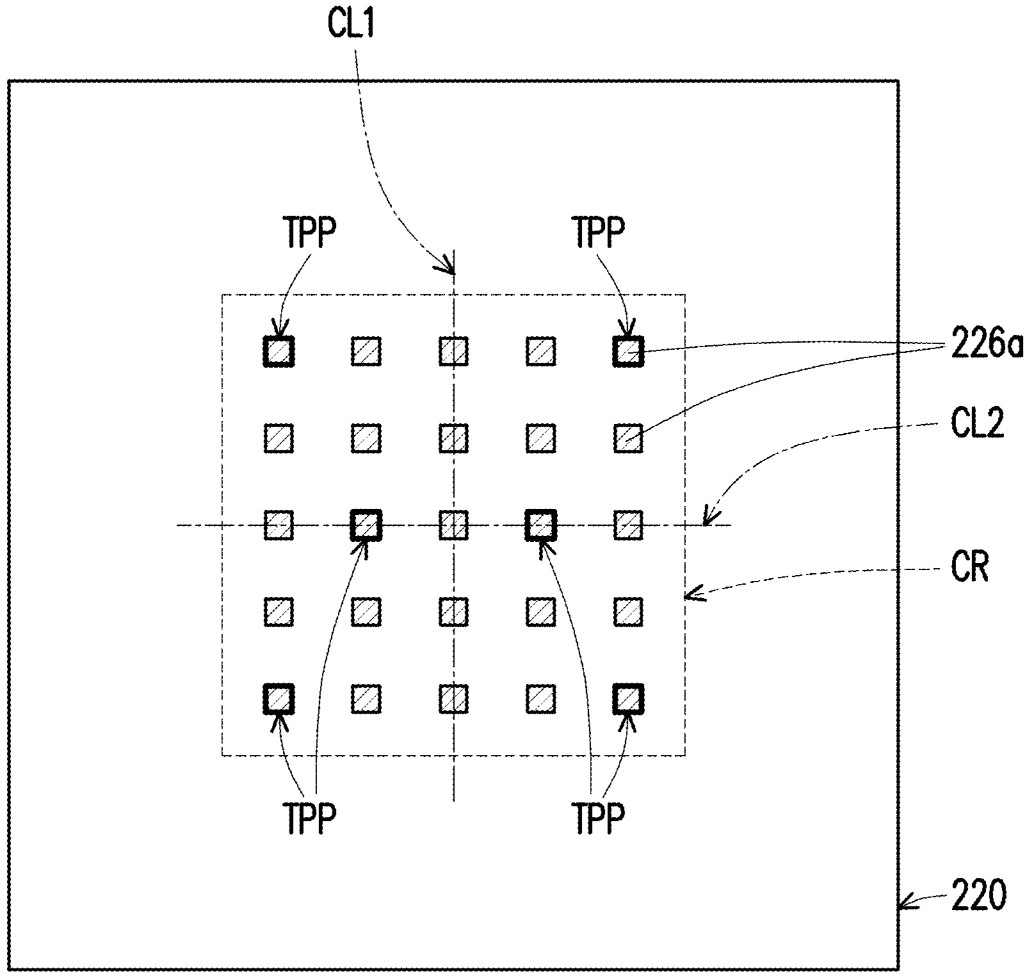

Alternatively, the testing points TPP may be arranged in a symmetric manner along a central line (e.g. CL1 and/or CL2) of the chip region CR. The testing points TPP arranged in the symmetric manner along the central line CL1 and/or CL2 of the chip region CR may be arranged on the central line CL1 and/or CL2. Or, the testing points TPP arranged in the symmetric manner along the central line CL1 and/or CL2 of the chip region CR may not be arranged on the central line CL1 and/or CL2. In some embodiments, as shown in FIG. 11, there are six testing points TPP, where the testing points are arranged in a symmetric manner along the central line CL1 and/or CL2 of the chip region CR, where only two of the six testing points TPP are arranged on the central line CL2, and there is no testing points TPP located at the center of the chip region CR.

Figure 12:
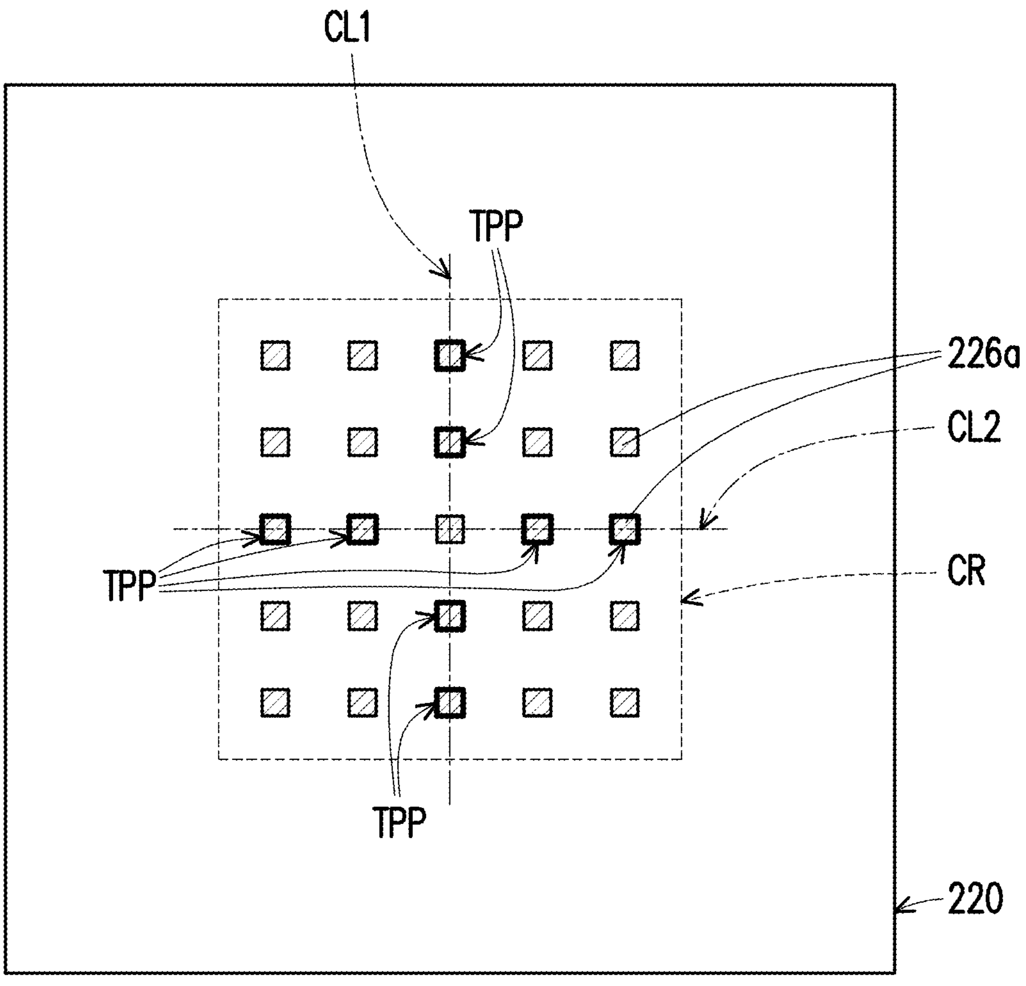
Figure 13:
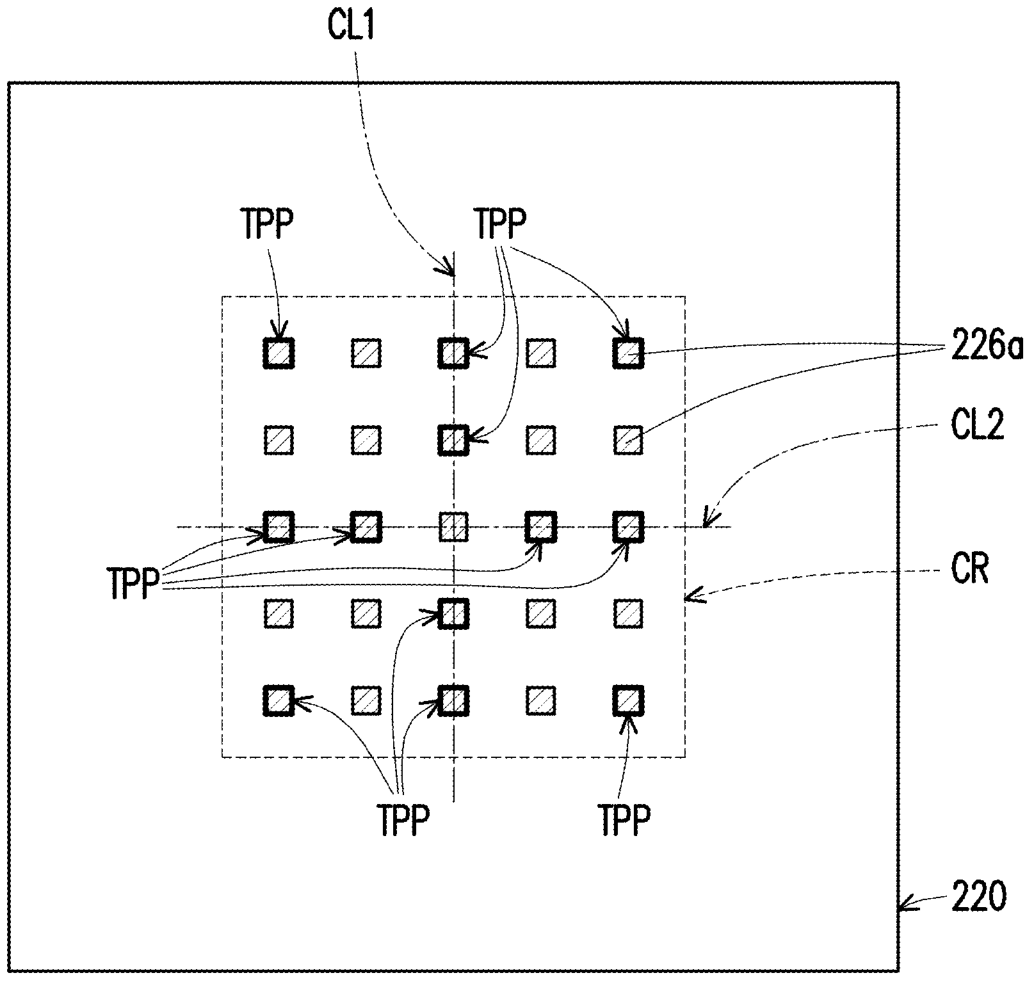
Figure 14A:
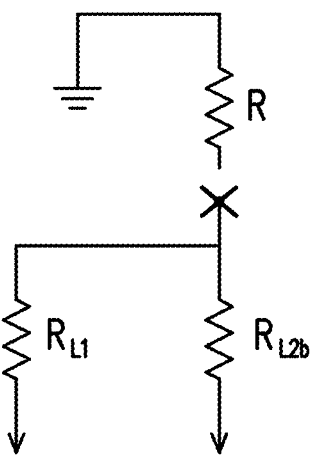
FIG. 14A is an exemplary equivalent circuit diagram of an assembly in accordance with some embodiments.
Figure 14B:
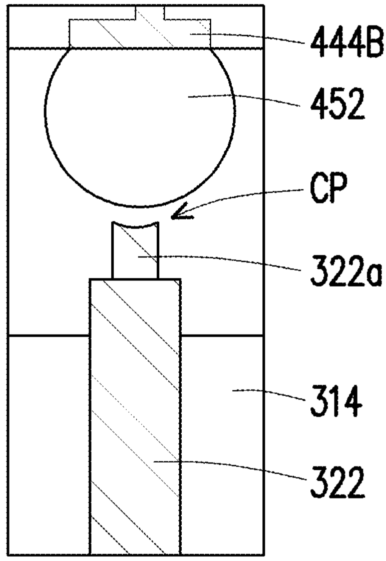
FIG. 14B is an enlarged diagram of a portion of the assembly depicted in FIG. 14A.
Figure 15A:
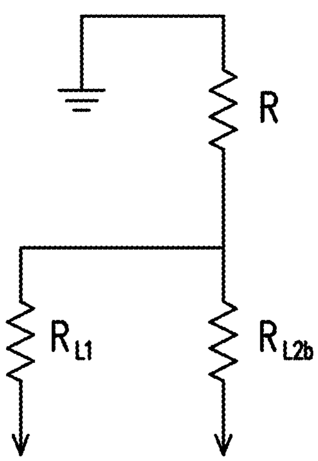
FIG. 15A is an exemplary equivalent circuit diagram of an assembly in accordance with some embodiments.
Figure 15B:
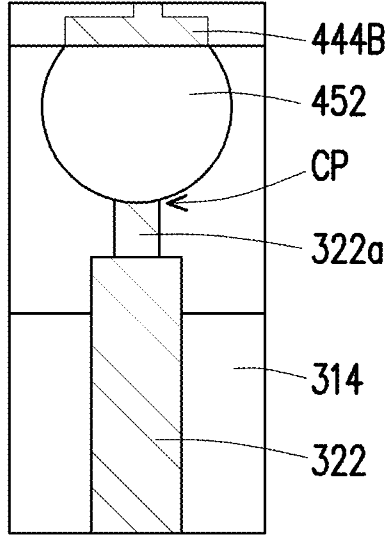
FIG. 15B is an enlarged diagram of a portion of the assembly depicted in FIG. 15A.
Figure 16A:
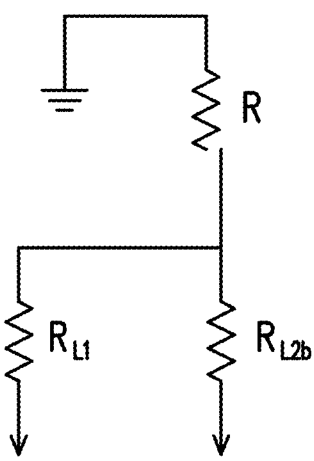
FIG. 16A is an exemplary equivalent circuit diagram of an assembly in accordance with some embodiments.
Figure 16B:
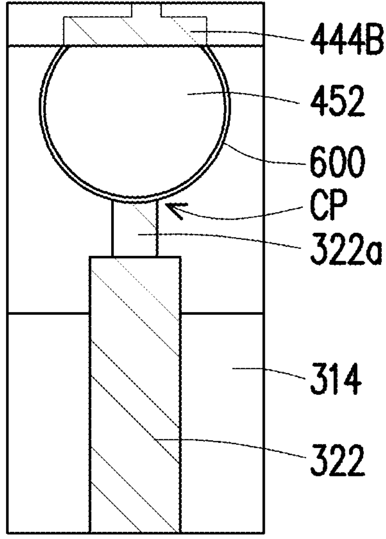
FIG. 16B is an enlarged diagram of a portion of the assembly depicted in FIG. 16A.

However, the disclosure is not limited thereto. The testing points TPP may include eight testing points TPP, where four testing points TPP may be located on the central line CL1 and other four testing points TPP may be located on the central line CL2, and there is no testing points TPP located at the center of the chip region CR, as shown in FIG. 12. On the other hand, the testing points TPP may include twelve testing points TPP, where four testing points TPP may be located on the central line CL1, four testing points TPP may be located on the central line CL2 and four testing points TPP may be randomly located on the chip region CR, and there is no testing points TPP located at the center of the chip region CR, as shown in FIG. 13. In the above embodiments (FIG. 11 through FIG. 13), there is no testing point TPP located on the center (e.g. an intersection of the central lines CL1 and CL2) of the chip region CR. However, the disclosure is not limited thereto; alternatively, there may be one testing point TPP located on the center of the chip region CR.

It should be noted that the number of the testing points TPP and the positioning locations thereof are not limited to the disclosure as long as the number of the testing points is greater than 3 and the following conditions (e.g., locating at the center of the chip region CR or in a symmetric arrangement) are fulfilled. Owing to testing points TPP connecting to the testing patterns TP and their locations, the warpage of the object to-be-tested DUT can be determined.

In one embodiment, if the resistance R at the contact point CP corresponding to the testing points TPP located at the periphery of the chip region CR are considered as good contact while the resistance R at the contact point CP corresponding to the testing point(s) TPP located at or near to the center of the chip region CR are considered as no contact, the cross-section of the object to-be-tested DUT is in a bowing shape with a concave warpage (i.e. smile profile) in respect with the contact point CP corresponding to the testing point(s) TPP located at or near to the center of the chip region CR. In another one embodiment, if the resistance R at the contact point CP corresponding to the testing points TPP located at the periphery of the chip region CR are considered as no contact while the resistance R at the contact point CP corresponding to the testing point(s) TPP located at or near to the center of the chip region CR are considered as good contact, the cross-section of the object to-be-tested DUT is in a bowing shape with a convex warpage (i.e. crying profile) in respect with the contact point CP corresponding to the testing point(s) TPP located at or near to the center of the chip region CR. With above embodiments, the warpage of the object to-be-tested DUT is detected.

Furthermore, if the resistance R at the contact point CP corresponding to the testing points TPP located at the periphery of the chip region CR are considered as good contact or bad contact while the resistance R at the contact point CP corresponding to the testing point(s) TPP located at or near to the center of the chip region CR are considered as good contact or bad contact, the cross-section of the object to-be-tested DUT is in substantial flat shape. In other words, no warpage of the object to-be-tested DUT is detected.

In the disclosure, the status of one connection (e.g. one contact point CP) between the object to-be-tested DUT and the socket 300 is determined by a value of the resistance R at the contact point CP (corresponding to the testing point TPP), so that the warpage of the object to-be-tested DUT (e.g. the semiconductor package 400) is detected by the status of the connection (related to the resistance R) as mentioned above. In the disclosure, through the testing patterns TP, a calculation of the resistances R can be implemented by a two-step measurement at each of the testing points TPP.

Figure 17A:
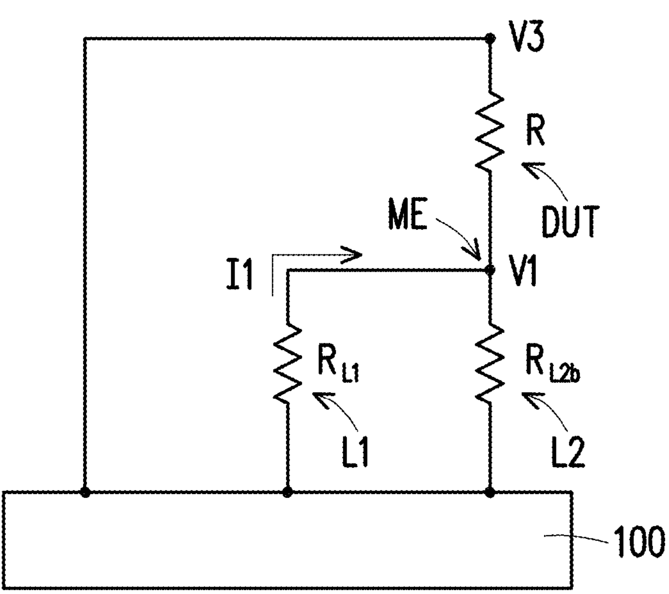
FIG. 17A and FIG. 17B are exemplary equivalent circuit diagrams of a testing method using an assembly in accordance with some embodiments.
Figure 17B:
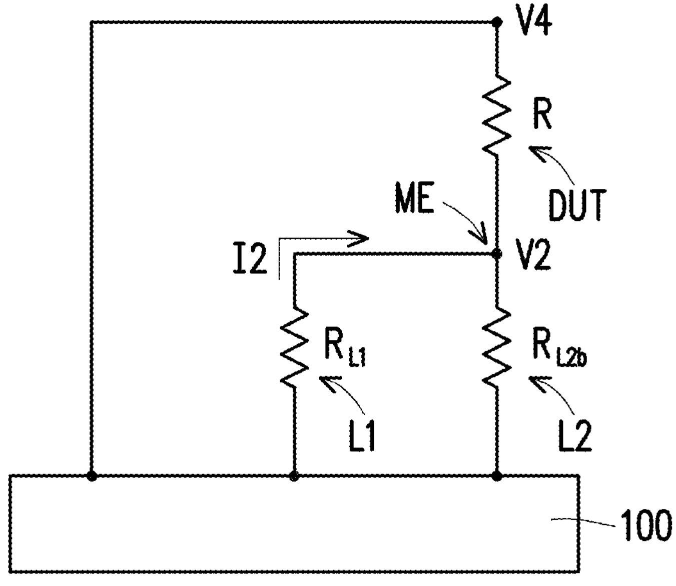

In some embodiments, the two-step measurement may be performed, but not limited to, by (1) providing a first current I1 (generated from the testing module 100) to the object to-be-tested DUT and measuring a first voltage V1 at a side of the object to-be-tested DUT (i.e., at the merged edge ME of the conductive line L2) and a voltage V3 at other side of the object to-be-tested DUT by the testing module 100, as shown in FIG. 17A; and (2) providing a second current I2 (generated from the testing module 100) to the object to-be-tested (denoted as DUT) and measuring a second voltage V2 at the side of the object to-be-tested DUT (i.e., at the merged edge ME of the conductive line L2) and a voltage V4 at the other side of the object to-be-tested DUT by the testing module 100, as shown in FIG. 17B. With the given currents I1, I2 and the measured voltages V1-V4, the resistance R for each contact point between the object to-be-tested DUT and the socket 300 can be calculated. For example, the voltages V3 and V4 are set to be a reference voltage given by the testing module 100. The voltages V3 and V4 are identical to each other, in some embodiments. The voltages V3 and V4 may be 0 Volt (V). Alternatively, the voltages V3 and V4 may be less than or substantially equal to 150 μV or any suitable volt, such as 100 μV. In some embodiments, the voltage V3 is a reference voltage given by the testing module 100. In the disclosure, the current I1 is different from the current I2. For example, the current I1 is less than the current I2, where the current I1 is greater than or substantially equal to zero ampere (0.0 A). Using the two-step measurement, a current difference between an actual current provided to the conductive line L1 by the testing module 100 and a desired current designated to the testing module 100 and the current loss across a current-current wire (e.g. the conductive line L1) are eliminate. In addition, using the two-step measurement, a voltage dropped across current-current wires (e.g. the conductive line L1 (i.e. a resistance $R_{L1}$) and the branch portion L2*b* of the conductive line L2 (i.e. a resistance $R_{L2b}$)) is also eliminated. Therefore, a measurement accuracy in the resistance R at a contact point between the object to-be-tested DUT and the socket 300 is achieved, thereby improving reliability of the test apparatus 1000 for determining the warpage of the object to-be-tested.

For example, as shown in FIG. 4A and FIG. 4B, the testing patterns TP (each including the conductive lines L1, L2) are formed in a layer where the metal trace 266*b* formed in. That is, the testing patterns TP and the metal traces 226*b* are formed simultaneously. However, the testing patterns TP may be formed in any one of the build-up layers included in the circuit board 220. The formation and material of the testing patterns TP are the same or similar the formation and material of the metal traces 226 as described in FIG. 3, and thus are not repeated for brevity. In some embodiments, the testing patterns TP are electrically connected to the metal vias 224*b* underlying thereto to transmit signal from/to the underlying connectors (e.g. the connectors 230 of the circuit board structure 200, the conductive contacts 120 of the testing module, etc.), and are electrically connected to the metal vias 224*a* overlying thereto to transmit signal from/to the overlying connectors (e.g. the metal trace 226*a* (also denoted as TPP), connectors (e.g. 320) of the socket 300, etc.). In some embodiments, a width D1 of the conductive lines L1 is approximately ranging from 0.10 mm to 50.0 mm. In some embodiments, a width D2 of the conductive lines L2 is approximately ranging from 0.10 mm to 50.0 mm. In one embodiment, the width D1 is the same as the width D2. In an alternative embodiment, the width D1 is different from the width D2.

In some embodiments, a distance SP1 between the conductive lines L1 and L2, which are not merged together yet, in one testing pattern TP is approximately ranging from 1 mm to 500 mm. However, the distance SP1 is not limited in the disclosure, and may be any suitable distance. In some embodiments, a distance SP2 between the merged edge ME of the conductive line L2 and an edge of the testing point TPP electrically connected thereto is less than or equal to 2.0 cm. In some embodiments, a distance SP3 between two adjacent testing points TPP is greater than or equal to 1.0 cm.

Back to FIG. 2 through FIG. 3, in some embodiments, the socket 300 is located on and electrically connected to the circuit board structure 200 (e.g. the surface S222*t* of the circuit board 220). For example, the socket 300 includes a base 310, a plurality of conductive connectors 320 penetrating therethrough and a cover 330 located on the base 310. In some embodiments, the connectors 320 are electrically connected to the metal trace 226*a* within the chip-region CR of the circuit board 220. In some embodiments, the base 310 is electrically isolated from the circuit board structure 200.

In some embodiments, the base 310 includes a flange portion 310 and a central portion 314, where the flange portion 312 is at a periphery of the central portion 314. For example, as shown in FIG. 3, a cross-section of the base 310 is in a H-shape. On the other hand, the base 310 may be in a rectangular shape. Alternatively, in the top view, the base 310 may be in a square-shape, a circle-shape, an ellipse-shape, or any suitable polygonal shape. In some embodiments, the material of the base 310 include a dielectric material capable of providing a specific stiffness that ensuring the physical and mechanical strength of the sockets 300. The stiffness (which may be quantified by its Yong's modulus) can be in the range of about 10 GPa to about 30 GPa.

For example, as shown in FIG. 3, a recess R1 is confined by an inner surface 312*i* of the flange portion 312, a surface 314*t* of the central portion 314 and the cover 330, and a recess R2 is confined by the inner surface 312*i* of the flange portion 312, a surface 314*b* of the central portion 314 and the circuit board 220. For example, the surface 314*t* is opposite to the surface 314*b* along the stacking direction, where the surface 314*t* is facing away from the circuit board 220 while the surface 314*b* is facing towards the circuit board 220. In some embodiments, the recess R1 is configured to be the accommodating space for the object to-be-tested DUT (e.g., the semiconductor package 400 in FIG. 5 through FIG. 7).

The central portion 314 may include a plurality of openings (not labeled). For example, as shown in FIG. 3, the openings penetrate through the central portion 314 in the stacking direction, where the conductive connectors 320 are respectively inserted into the openings and fixed to the base 310. In some embodiments, the conductive connectors 320 are in contact with the metal traces 226 of the circuit board 220 inside the recess R2 of the socket 300.

For example, the conductive connectors 320 includes a plurality of conductive connectors 322 and a plurality of conductive connectors 324. In some embodiments, the conductive connectors 322 are in contact with the metal traces 226*a* serving as the testing points TPP for transmitting testing electric signals (e.g. a current) and responsive electric signals (e.g. a voltage) to the object to-be-tested DUT, while the conductive connectors 324 are in contact with the rest of the metal traces 226*a* within the chip region CR for electrically grounding a ground plate of the object to-be-tested DUT or for providing a reference voltage to the ground plate of the object to-be-tested DUT.

The conductive connectors 322 each may include a body portion 322*c* and two end portions 322*a*, 322*b* respectively connecting to two opposite sides of the body portion 322*c*. For example, as shown in FIG. 3, one conductive connector 322 is connected to a respective metal trace 226*a* serving as the testing point TPP through the end portion 322*b*, where the end portion 322*a* of the conductive connector 322 is electrically connected to the object to-be-tested DUT (e.g. the semiconductor package 400). In other words, the end portions 322*a* are referred to as the contact points CP (denoted in FIGS. 14B, 15B and 16B).

On the other hand, the conductive connectors 324 each may include a body portion 324*c* and two end portions 324*a*, 324*b* respectively connecting to two opposite sides of the body portion 324*c*. For example, as shown in FIG. 3, one conductive connector 324 is connected to a respective metal trace 226*a* (not serving as the testing point TPP) through the end portion 324*b*, where the end portion 324*a* of the conductive connector 324 is electrically connected to the object to-be-tested DUT (e.g. the semiconductor package 400).

In some embodiments, the conductive connectors 320 (including 322 and 324) are pogo pins to establish proper physical contacts between the end portions (e.g., 322*a*/322*b*, 324*a*/324*b*) and an overlying or underlying component (e.g., the object to-be-tested DUT or the circuit board 220). Such that, an electrical connection path between the testing module 100 to the socket 300 is established. In the disclosure, the end portions (e.g., 322*a*, 324*a*) of the conductive connectors 320 are referred to as conductive terminals of the testing apparatus 1000.

Alternatively, the conductive connectors 322 and/or 324 may be any suitable conductive connectors which are capable of establishing the proper physical contacts as mentioned. Only three conductive connectors 322 and two conductive connectors 324 are shown in FIG. 3 for illustrative purposes, the disclosure is not limited thereto. The numbers of the conductive connectors 320 (including 322 and 324) is selected and designated based on the demand and the design requirement.

In some embodiments, the cover 330 is made of a material similar to or identical to the material of the base 310. In addition, the cover 330 may include a heat dissipating element having a high thermal conductivity, for example, between about 200 W/(m·K) to about 400 W/(m·K) or more. The heat dissipating element may be formed in form of a block or a block with fins standing thereon, using a metal, a metal alloy, and the like. In some embodiments, the cover 330 may provide physical protection to the object to-be-tested DUT in addition to the functionality of dissipating heat.

As shown in FIG. 3, for example, the socket 300 is installed onto the circuit board structure 200 through the holding device 500. In some embodiments, the holding device 500 includes a plurality of blots 510 and a plurality of fasteners 530, as shown in FIG. 2 and FIG. 3. In some embodiments, the bolts 510 penetrate through the socket 300 (including a base 310 and a cover 330) and the circuit board 220, and the fasteners 630 are respectively threaded onto the bolts 510 and tightened to clamp the socket 300 and the circuit board 220. The fasteners 530 may be, e.g., nuts that thread to the bolts 510. As shown in FIG. 3, the flange portion 312 directly stands on the surface S222*t* of the circuit board 220, for example.

However, the disclosure is not limited thereto; alternatively, a socket adopter (not shown) may be installed onto the surface S222*t* of the circuit board structure 200, where the socket adopter is configured to engage with the socket 300 and allows the socket 300 being electrically connected to the circuit board 220 underlying thereto. In such alternative embodiments, the holding device 500 may be omitted.

Figure 5:
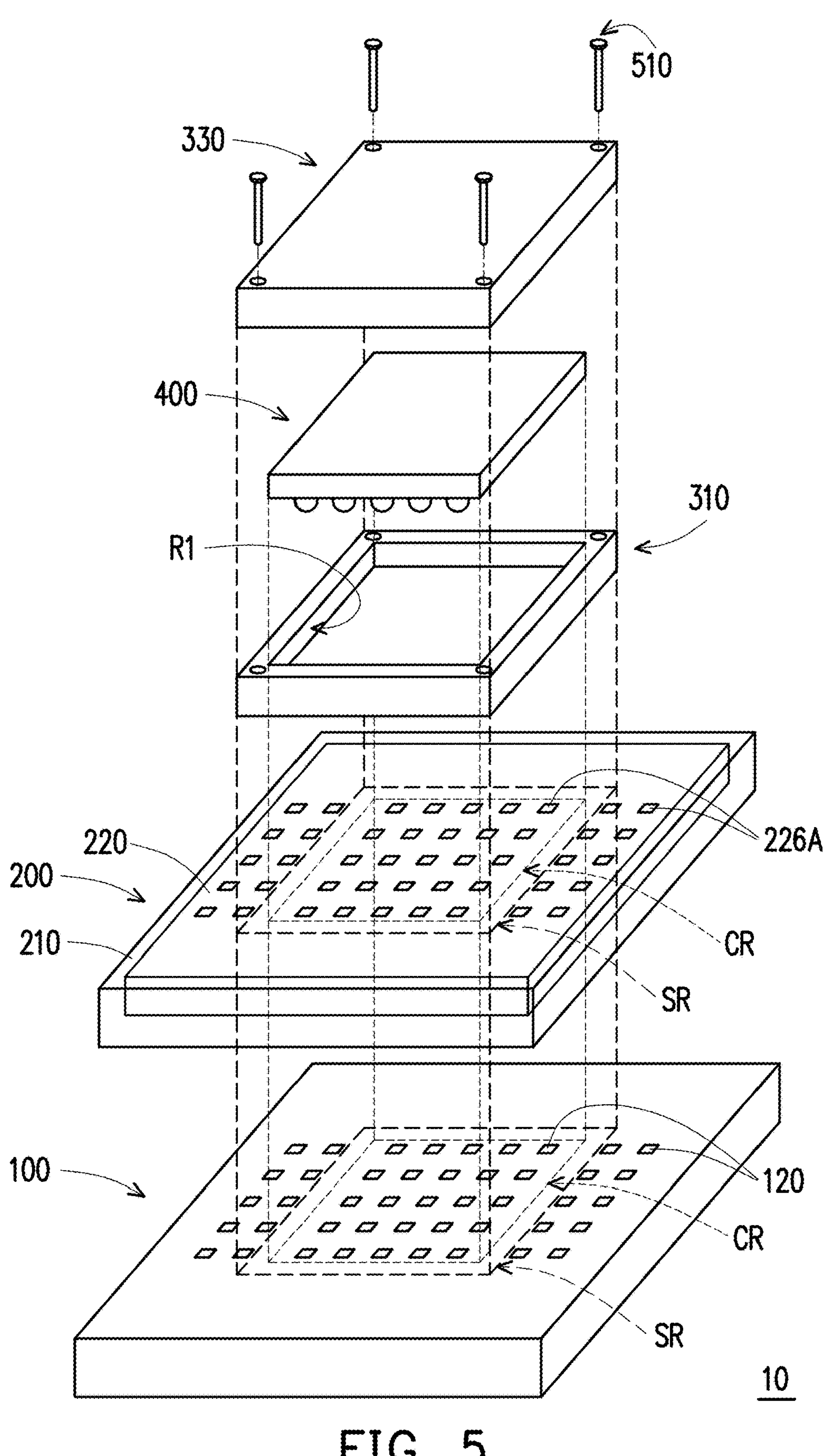
FIG. 5 is a schematic explosive view illustrating an assembly of a testing apparatus and a semiconductor package in accordance with some embodiments of the disclosure.
Figure 6:
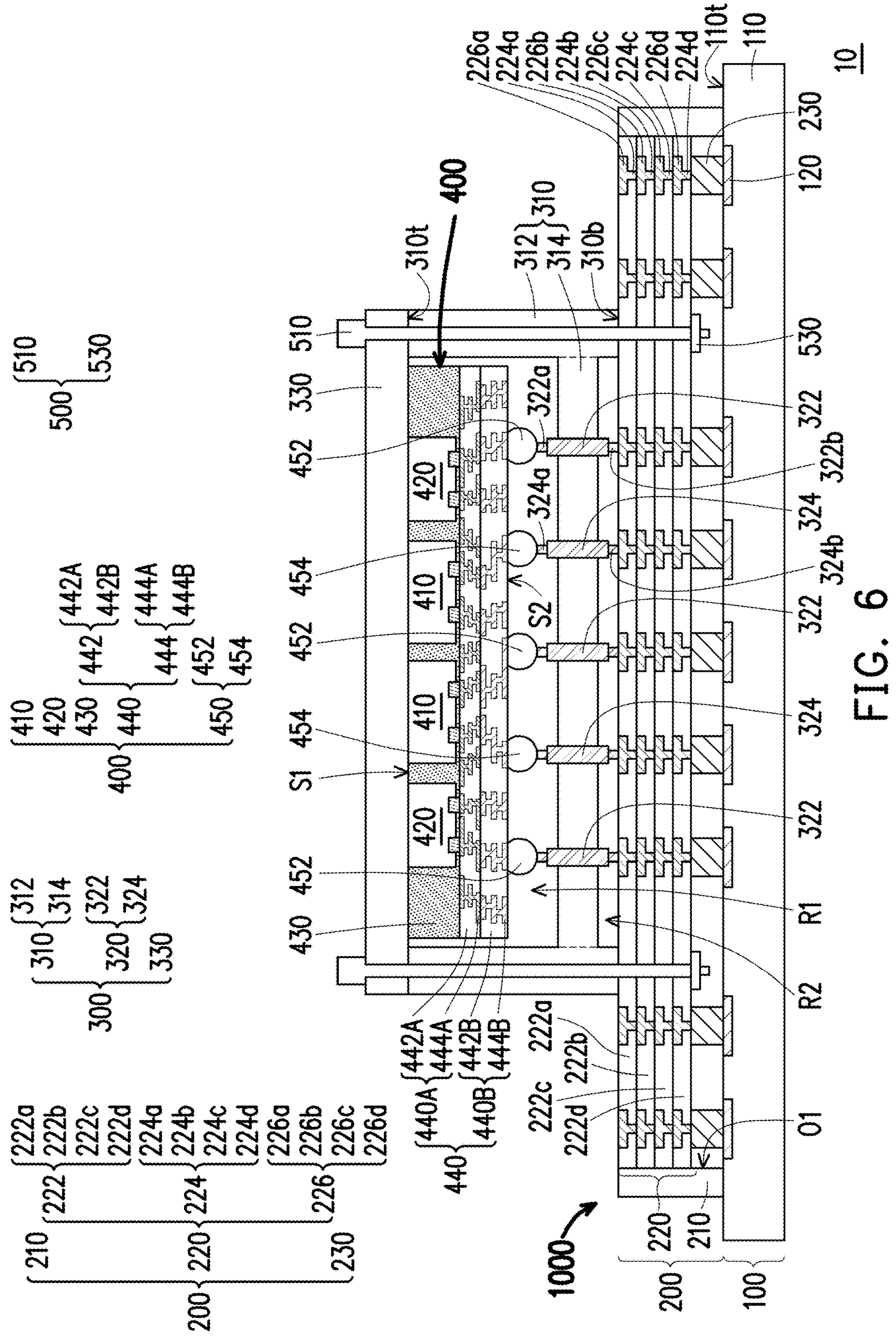
FIG. 6 is a schematic cross-sectional view of the assembly depicted in FIG. 5.
Figure 7:
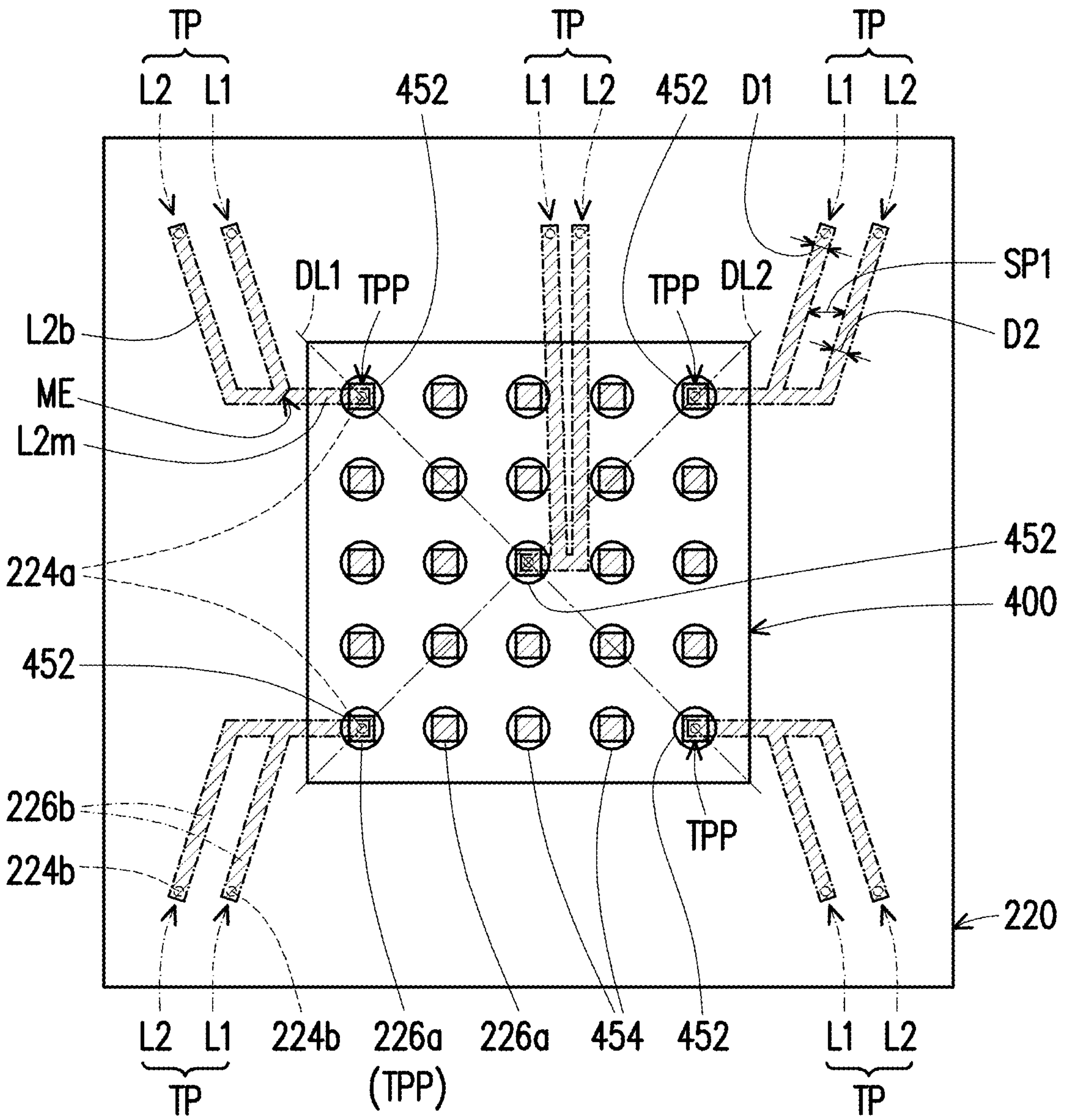
FIG. 7 is a schematic plane view illustrating a relative position of a portion of components of a circuit board structure of the testing apparatus and conductive terminals of the semiconductor package included in the assembly depicted in FIG. 5.

FIG. 5 is a schematic explosive view illustrating an assembly 10 of a testing apparatus 1000 and a semiconductor package 400 in accordance with some embodiments of the disclosure. FIG. 6 is a schematic cross-sectional view of the assembly 10 depicted in FIG. 5. FIG. 7 is a schematic plane view illustrating a relative position of a portion of components of a circuit board 220 of the testing apparatus 1000 and conductive elements 450 of the semiconductor package 400 included in the assembly 10 depicted in FIG. 5, where FIG. 6 shows the cross-sectional view taken along a dotted line (DL1 or DL2) depicted in FIG. 7. The elements similar to or substantially the same as the elements described previously will use the same reference numbers, and certain details or descriptions (e.g. the materials, positioning configurations, electrical connection relationships, etc.) of the same elements would not be repeated herein.

In some embodiments, a semiconductor package is installed on the testing apparatus, in accordance with step S120 of FIG. 1. For example, as shown in FIG. 5, FIG. 6, and FIG. 7, the semiconductor package 400, which is referred to as the object to-be-tested DUT as previously mentioned, is provided and placed into the accommodated space (e.g. the first recess R1) of the socket 300 and electrically coupled to the testing apparatus 1000 to construct the assembly 10. For example, the semiconductor package 400 includes a plurality of semiconductor dies 410, a plurality of input/output (I/O) interface dies 420, an insulating encapsulation 430, a redistribution circuit structure 440 and a plurality of conductive elements 450, as shown in FIG. 6. In some embodiments, the conductive elements 450 are the interfaces for external connections to the semiconductor package 400. That is, the conductive elements 450 serve as the conductive terminals of the semiconductor package 400 to electrical connect with the external devices/apparatus (e.g., the socket 300 (via the conductive connectors 320)) for transmitting (outputting and/or inputting) electric signals, power signals, or ground signals. In alternative embodiments, a semiconductor device (now shown) is optionally bonded to the semiconductor package 400 in a manner similar to the conductive elements 450. The semiconductor device may be an integrated passive element (IPD) or a surface mount device (SMD), the disclosure is not limited thereto. It is appreciated that a thickness of the semiconductor device is less than a thickness of each of the conductive elements 450.

In some embodiments, if considering a top view along the stacking direction, the semiconductor package 400 is in a form of chip-size being greater than or substantially equal to 400 $mm^2$. Alternatively, the semiconductor package 400 may be in a wafer or panel form. In other words, the semiconductor package 400 is processed in the form of a reconstructed wafer/panel. In alternative embodiments, if considering the top view along the stacking direction, the semiconductor package 400 is in a form of wafer-size having a diameter of about 4 inches or more. In further alternative embodiments, the semiconductor package 400 is in a form of wafer-size having a diameter of about 6 inches or more. In yet further alternative embodiments, the semiconductor package 400 is in a form of wafer-size having a diameter of about 8 inches or more. Or alternatively, the semiconductor package 400 is in a form of wafer-size having a diameter of about 12 inches or more.

The semiconductor dies 410 and the I/O interface dies 420 may be arranged aside to each other along a horizontal direction. In some embodiments, the semiconductor dies 410 are arranged in the form of a matrix, such as a N'×N' array or a N'×M' array (N', M'>0, N' may or may not be equal to M'), while the I/O interface dies 420 are arranged to surround the semiconductor dies 410 (arranged into the array/matrix) for providing additional input/output circuitries thereto, and thus more I/O counts are provided to the semiconductor dies 410. The matrix of the I/O interface dies 420 may be a N"×N" array or a N"×M" array (N", M">0, N" may or may not be equal to M"). That is, in such embodiments, the I/O interface dies 420 are arranged into a matrix surrounding the perimeter of the matrix of the semiconductor dies 410.

However, the disclosure is not limited thereto, in an alternative embodiment, the semiconductor dies 410 and the I/O interface dies 420 are arranged in the form of a matrix, such as the Na×Na array or Na×Ma array (Na, Ma>0, Na may or may not be equal to Ma). With such embodiments, the semiconductor dies 410 and the I/O interface dies 420 are arranged into the matrix in an alternation manner. In a further alternative embodiment, the semiconductor dies 410 are arranged in the form of a first matrix and the I/O interface dies 420 are arranged in the form of a second matrix, where the first and second matrices are Nb×Nb array or Nb×Mb array (Nb, Mb>0, Nb may or may not be equal to Mb), and the first and second matrices are positioned next to each other along the direction X or the direction Y.

In some embodiments, the semiconductor dies 410 have a plurality of conductive vias 412, where the conductive vias 412 serve as conductive terminals of the semiconductor dies 410 for electrical connection to other devices/elements (e.g., the redistribution circuit structure 440. The semiconductor dies 410 each described herein may be referred to as a semiconductor chip or an integrated circuit (IC). For example, the semiconductor dies 410, independently, are a logic chip, such as a central processing unit (CPU), graphics processing unit (GPU), system-on-chip (SoC), system-on-integrated-circuit (SoIC), microcontroller, or the like. However, the disclosure is not limited thereto; in alternative embodiments, the semiconductor dies 410, independently, are a digital chip, analog chip or mixed signal chip, such as an application-specific integrated circuit (ASIC) chip, a sensor chips, a wireless and radio frequency (RF) chip, a baseband (BB) chip, a memory chip (such as high bandwidth memory (HBM) dies) or a voltage regulator chip. In further alternative embodiments, the semiconductor dies 410, independently, are referred to as a chip or an IC of combination-type, such as a WiFi chip simultaneously including both of a RF chip and a digital chip. In some embodiments, a type of a first group of the semiconductor dies 410 are different from a type of a second group of the semiconductor dies 410. In other words, the semiconductor dies 410 may include semiconductor chips or ICs of different types and/or the same type; the disclosure is not limited thereto. For example, the first group of the semiconductor dies 410 includes logic dies, while the second group of the semiconductor dies 410 includes memory dies.

In some embodiments, the I/O interface dies 420, independently, have a plurality of conductive vias 422, where the conductive vias 422 serve as conductive terminals of the I/O interface dies 420 for electrical connection to other devices/elements (e.g., the redistribution circuit structure 440. As shown in FIG. 6, only two semiconductor dies 410 and two I/O interface dies 420 are presented for illustrative purposes, however, it should be noted that the number of the semiconductor dies 410 and the number of the I/O interface dies 420 may be one or more than one, the disclosure is not limited thereto.

In some embodiments, the semiconductor dies 410 and the I/O interface dies 420 are encapsulated in the insulating encapsulation 430. For example, the insulating encapsulation 430 laterally wraps around the semiconductor dies 410 and the I/O interface dies 420, where the conductive vias 412 of the semiconductor dies 410 and the conductive vias 422 of the I/O interface dies 420 are accessibly exposed by the insulating encapsulation 430. As shown in FIG. 6, illustrated bottom surfaces of the conductive vias 412 and the conductive vias 422 are substantially leveled with an illustrated bottom surface of the insulating encapsulation 430. That is, in some embodiments, the illustrated bottom surfaces of the conductive vias 412, the surfaces of the conductive vias 422 and the bottom surface of the insulating encapsulation 430 are substantially coplanar to each other for achieving a high degree of coplanarity to facilitate the formation of a later-formed element (e.g., the redistribution circuit structure 440). It is appreciated that the illustrated bottom surfaces of the conductive vias 412 and the conductive vias 422 depicted in FIG. 6 are equivalent to active sides of the semiconductor dies 410 and the I/O interface dies 420, respectively.

In some embodiments, a sidewall of each conductive via 412 of the semiconductor dies 410 is partially covered (e.g. in physical contact with) by the insulating encapsulation 430. In some embodiments, a sidewall of each conductive via 422 of the I/O interface dies 420 is partially covered (e.g. in physical contact with) by the insulating encapsulation 430. However, the disclosure is not limited thereto; alternatively, the sidewall of each conductive via 412 and the sidewall of each conductive via 422 are free from the insulating encapsulation 430. In further alternative embodiments, the sidewall of each conductive via 412 of the semiconductor dies 410 is partially covered (e.g. in physical contact with) by the insulating encapsulation 430, while the sidewall of each conductive via 422 of the I/O interface dies 420 is not covered by the insulating encapsulation 430. In yet further alternative embodiments, the sidewall of each conductive via 412 of the semiconductor dies 410 is not covered by the insulating encapsulation 430, while the sidewall of each conductive via 422 of the I/O interface dies 420 is partially covered (e.g. in physical contact with) by the insulating encapsulation 430.

On the other hand, as shown in FIG. 6, illustrated top surfaces (e.g., non-active sides) of the semiconductor dies 410 and the I/O interface dies 420 may be substantially leveled with an illustrated top surface of the insulating encapsulation 430. For example, the illustrated top surfaces of the semiconductor dies 410 and the I/O interface dies 420 are substantially coplanar to the illustrated top surface of the insulating encapsulation 430.

The insulating encapsulation 430 may include an acceptable insulating encapsulation material. The insulating encapsulation 430, for example, includes polymers (such as epoxy resins, phenolic resins, silicon-containing resins, or other suitable resins), dielectric materials, or other suitable materials. The insulating encapsulation 430 may be a molding compound formed by a molding process. The insulating encapsulation 430 may further include inorganic filler or inorganic compound (e.g. silica, clay, and so on) which can be added therein to optimize coefficient of thermal expansion (CTE) of the insulating encapsulation 430. The disclosure is not limited thereto.

In some embodiments, the redistribution circuit structure 440 is located over the semiconductor dies 410, the I/O interface dies 420 and the insulating encapsulation 430. As shown in FIG. 6, the redistribution circuit structure 440, for example, includes a fine-featured portion 440A and a coarse-featured portion 440B, and is electrically connected to the semiconductor dies 410 and the I/O interface dies 420 through connecting to the conductive vias 412 of the semiconductor dies 410 and the conductive vias 422 of the I/O interface dies 420 exposed by the insulating encapsulation 430. In some embodiments, the fine-featured portion 440A is located between the coarse-featured portion 440B and the semiconductor dies 410 and between the coarse-featured portion 440B and the I/O interface dies 420. In some embodiments, the fine-featured portion 440A of the redistribution circuit structure 440 is formed over and electrically coupled to the semiconductor dies 410 and the I/O interface dies 420, and the coarse-featured portion 440B is electrically coupled to the semiconductor dies 410 and the I/O interface dies 420 through the fine-featured portion 440A. For example, as shown in FIG. 6, the fine-featured portion 440A is capable of providing local electrical communications between the semiconductor dies 410, between the I/O interface dies 420 and between the semiconductor dies 410 and the I/O interface dies 420, while the coarse-featured portion 440B is capable of providing global electrical communications between external devices/apparatus electrically connected to the conductive elements 450 and the semiconductor dies 410 and/or the I/O interface dies 420.

For example, the fine-featured portion 440A includes a dielectric structure 442A and a metallization pattern 444A located in the dielectric structure 442A, and the coarse-featured portion 440B includes a dielectric structure 442B and a metallization pattern 444B located in the dielectric structure 442B. The metallization patterns 444A and the metallization patterns 444B independently may include one or more patterned conductive layers (which being individually referred to as redistribution layers), while the dielectric structures 442A and the dielectric structures 442B independently may include one or more dielectric layers arranged alternatively with the patterned conductive layers. For example, the one or more patterned conductive layers, which are electrically connected to each other, includes line portions (also referred to as conductive lines or traces) extending on the horizontal plane and via portions (also referred to as conductive vias) extending on the stacking direction and electrically connected to the line portions (together referred to as an internal routing circuit) for providing routing functionality. In addition, the one or more patterned conductive layers further include plane portions extending on the horizontal plane and other via portions extending on the stacking direction electrically connected to the plane portions (together referred to as a ground plate or ground plane) for being electrically grounded. In such case, the plane portions are electrically isolated from the rest of the metallization pattern 444A and the rest of the metallization pattern 444B. For example, one line portion and one plane portion located in the same patterned conductive layer in either the fine-featured portion 440A or the coarse-featured portion 440B are electrically isolated from one another through a slit, where the slit is filled with the dielectric material made for the dielectric structure 442A or 442B. The number of the dielectric layers included in one dielectric structure 442A or 442B and the number of the patterned conductive layers included in one metallization pattern 444A or 444B may not be limited to the drawings of the disclosure, and may be selected and designated based on the demand and design requirements.

The fine-featured portion 440A and the coarse-featured portion 440B of the redistribution circuit structure 440 include metallization patterns and dielectric structures of differing sizes, as shown in FIG. 7, for example. In certain embodiments, the patterned conductive layers included in the metallization pattern 444A are formed from a same conductive material, and are formed to a same thickness (e.g., a first thickness) and a same line width (e.g., a first line width), and the patterned conductive layers included in the metallization pattern 444B are formed from a same conductive material, and are formed to a same thickness (e.g., a second thickness) and a same line width (e.g., a second line width). Likewise, in some embodiments, the dielectric layers included in the dielectric structure 442A are formed from a same dielectric material and are formed to a same thickness, and the dielectric layers included in the dielectric structure 442B are formed from a same dielectric material and are formed to a same thickness. In some embodiments, along the stacking direction, the patterned conductive layers included in the metallization pattern 444A have the first thickness that is smaller than the second thickness of the patterned conductive layers included in the metallization pattern 444B. On the other hand, on the top view (e.g., on the horizontal plane), the patterned conductive layers included in the metallization pattern 444A have the first line width that is smaller than the second line width of the patterned conductive layers included in the metallization pattern 444B.

The material of the dielectric structures 442A, 442B may include polyimide, epoxy resin, acrylic resin, phenol resin, benzocyclobutene (BCB), polybenzoxazole (PBO), or any other suitable polymer-based dielectric material, and may be formed by deposition, lamination or spin-coating. The material of the metallization patterns 444A, 444B may include aluminum, titanium, copper, nickel, tungsten, and/or alloys thereof, and may be formed by electroplating or deposition. The disclosure is not limited thereto. The dielectric structures 442A, 442B and the metallization patterns 444A, 444B independently may also be patterned by a photolithography and etching process.

The material of the dielectric structure 442A is, for example, as the same as the material of the dielectric structure 442B. For another example, the materials of the dielectric structures 442A and 442B are different from one another. The material of the metallization pattern 444A is, for example, as the same as the material of the metallization pattern 444B. For another example, the materials of the metallization patterns 444A and 444B are different from one another. The disclosure is not limited thereto. In alternative embodiments, the redistribution circuit structure 440 may include metallization patterns of same size and dielectric structures of same size.

In some embodiments, the conductive elements 450 are attached to the redistribution circuit structure 440 for electrically coupling therebetween, as shown in FIG. 6. For example, as shown in FIG. 6, the semiconductor package 400 has an illustrated top surface S1 and an illustrated bottom surface S2 opposite to the illustrated top surface S1 in the stacking direction, where the illustrated top surface S1 is in contact with the cover 330 of the socket 300, and the illustrated bottom surface S2 is distributed with the conductive elements 450.

The conductive elements 450 may include a plurality of conductive elements 452 and a plurality of conductive elements 454. For example, as shown in FIG. 6 and FIG. 7, the conductive elements 452 are in contact with (e.g. in proper physical connection to) the connectors 322 for electrically connected to the metal traces 226*a* serving as the testing points TPP, and the conductive element 452 are in contact with (e.g. in proper physical connection to) the connectors 322 for electrically connected to the metal traces 226*a* not serving as the testing points TPP. In some embodiments, the conductive elements 452 are electrically connected to the ground plate included in the redistribution circuit structure 440 for transmitting the testing electric signals (e.g., a current) and receiving responsive electric signals (e.g. a voltage). In some embodiments, some of the conductive elements 454 are electrically connected to the internal routing circuit include in the redistribution circuit structure 440 for identification of failures in interconnects inside the semiconductor package 400. In some embodiments, some of the conductive elements 454 are electrically connected to the ground plate included in the redistribution circuit structure 440 for electrically grounding a ground plate included in the redistribution circuit structure 440 or for providing a reference voltage to the ground plate included in the redistribution circuit structure 440. That is, for example, through the redistribution circuit structure 440, some of the conductive elements 454 are electrically connected to the semiconductor dies 410, and some of the conductive elements 454 are electrically connected to the I/O interface dies 420. The number of the conductive elements 450 (e.g. 452/454) is not limited to the drawings of the disclosure, and may be selected and designed based on the demand.

The conductive elements 450 may be disposed on the redistribution circuit structure 440 by ball placement process or reflow process. The conductive elements 450 are, for example, solder balls or ball grid array (BGA) balls or bumps. Alternatively, the conductive elements 450 may include micro-bumps, metal pillars, electroless nickel-electroless palladium-immersion gold (ENEPIG) formed bumps, controlled collapse chip connection (C4) bumps, or the like; and may be formed by plating. The conductive elements 450 may be solder free. In the alternative embodiments of which the semiconductor device(s) is included, the semiconductor device may be disposed on the redistribution circuit structure 440 by flip-chip bonding technology or surface device mounting technology.

In some alternative embodiments (not shown), before disposing/forming the conductive elements 450 on the redistribution circuit structure 440, a plurality of under-ball metallurgy (UBM) patterns are optionally formed on and electrically coupled to the redistribution circuit structure 440, where the strength of connection between the conductive elements 450 and the redistribution circuit structure 440 is enhanced. The conductive elements 450 may be placed on the UBM patterns through ball placement process. That is, the conductive elements 450 may be electrically coupled to the redistribution circuit structure 440 through the UBM patterns. In some embodiments, the UBM patterns are made of a metal layer including a single layer or a metallization layer including a composite layer with a plurality of sublayers formed of different materials. In some embodiments, the UBM patterns include copper, nickel, molybdenum, titanium, tungsten, titanium nitride, titanium tungsten, combinations thereof, or the like. For example, the UBM patterns include a titanium layer and a copper layer over the titanium layer. The UBM patterns may be formed using, for example, electroplating, sputtering, physical vapor deposition (PVD), or the like. However, the UBM patterns may be omitted from the redistribution circuit structure 440, the disclosure is not limited thereto.

As shown in FIG. 6, after the semiconductor package 400 is installed to the testing apparatus 1000; in such assembly 10, the semiconductor package 400 forms temporarily electrical connections with the testing apparatus 1000 through the conductive element 450 and the connectors 320 of the sockets 250, where the socket 300 secures the semiconductor package 400 in the assembly 10. With such electrical connections between the testing apparatus 1000 and the semiconductor package 400, the semiconductor package 400 is prepared to be tested by using the testing apparatus 1000, for example.

In some embodiments, an automated test sequence on the semiconductor package is performed through the testing apparatus, in accordance with step S130 of FIG. 1. In a testing method using the testing apparatus 1000, the assembly 10 may have several possible testing electrical transmitting paths to test the semiconductor package 400. For example, a testing electrical transmitting path is discussed below for illustrative purposes, however the disclosure is not limited herein.

In some embodiments, via the testing electrical transmitting path, the two-step measurement is performed for a warpage detection of the semiconductor package 400. For example, via the testing electrical transmitting path, the testing apparatus 1000, through the testing module 100, provides an electric signal (e.g. a first testing electric signal such as the current I1 generated from the controller of the testing module 100 as shown in FIG. 17A) to the semiconductor package 400 by way of the conductive contacts 120 of the testing module 100, the connectors 230 and the circuit board 200 (including the testing patterns TP and the testing points TPP) of the circuit board structure 200, the connectors 322 of the socket 300, the conductive elements 452 of the semiconductor package 400 and the redistribution circuit structure 440 of the semiconductor package 400 and also measuring a first initial voltage V1 at the merged point ME; and the electric signal (e.g., a first responsive electric signal, sometimes referred to as a loopback (feedback) signal, such as the voltage V3, as shown in FIG. 17A) is sent from the semiconductor package 400 to the controller of the testing module 100 by way of the redistribution circuit structure 440 of the semiconductor package 400, the conductive elements 454 of the semiconductor package 400, the connectors 324 of the socket 300, the connectors 230 and the circuit board 200 (excluding the testing patterns TP and the testing points TPP) of the circuit board structure 200, and the conductive contacts 120 of the testing module 100. For example, for the current I1 is provided to the conductive elements 452 of the semiconductor package 400 electrically connecting the ground plate included in the redistribution circuit structure 440 through the conductive lines L1 of the testing patterns TP while the voltage V1 is measured at the merged edges ME of the conductive lines L2 of the testing patterns TP. In some embodiments, the voltage V3 is a reference voltage given by the testing module 100.

Again, via the testing electrical transmitting path, the testing apparatus 1000, through the testing module 100, provides an electric signal (e.g. a second testing electric signal such as the current I2 generated from the controller of the testing module 100 as shown in FIG. 17B) to the semiconductor package 400 by way of the conductive contacts 120 of the testing module 100, the connectors 230 and the circuit board 200 (including the testing patterns TP and the testing points TPP) of the circuit board structure 200, the connectors 322 of the socket 300, the conductive elements 452 of the semiconductor package 400 and the redistribution circuit structure 440 of the semiconductor package 400 and also measuring a second initial voltage V2 at the merged point ME; and the electric signal (e.g., a second responsive electric signal, sometimes referred to as a loopback (feedback) signal, such as the voltage V4, as shown in FIG. 17B) is sent from the semiconductor package 400 to the controller of the testing module 100 by way of the redistribution circuit structure 440 of the semiconductor package 400, the conductive elements 454 of the semiconductor package 400, the connectors 324 of the socket 300, the connectors 230 and the circuit board 200 (excluding the testing patterns TP and the testing points TPP) of the circuit board structure 200, and the conductive contacts 120 of the testing module 100. For example, for the current I2 is provided to the conductive elements 452 of the semiconductor package 400 electrically connecting the ground plate included in the redistribution circuit structure 440 through the conductive lines L1 of the testing patterns TP while the voltage V2 is measured at the merged edges ME of the conductive lines L2 of the testing patterns TP. In some embodiments, the voltage V3 is a reference voltage given by the testing module 100. In the disclosure, the current I1 is different from the current I2. For example, the current I1 is less than the current I2, where the current I1 is greater than or substantially equal to zero ampere (0.0 A).

With such measurements, the resistances R at contact points CP between the semiconductor package 400 and the socket 300 are obtained by Equation (I) previously described, thereby the semiconductor package 400 is examined to confirm whether there is warpage issue via the testing apparatus 100. In addition, with such resistance R obtained by two-step measurement is also able to confirm whether there is a failure in interconnects inside the semiconductor package 400 or oxidation in the conductive elements 450 of the semiconductor package 400.

In accordance with some embodiments, a testing apparatus for a semiconductor package includes a circuit board, testing patterns and a socket. The circuit board has a testing region and includes a plurality of testing contacts and a plurality of signal contacts distributed in the testing region. The testing patterns are embedded in the circuit board and electrically connected to the testing contacts, where each of the testing patterns includes a first conductive line and a second conductive line including a main portion and a branch portion connected to main portion. The first conductive line is connected to the main portion. The socket is located on the circuit board and comprising connectors electrically connected to the circuit board, wherein the connectors are configured to transmit electric signals for testing the semiconductor package from the testing apparatus.

In accordance with some embodiments, a testing apparatus for a semiconductor package includes a circuit board, three or more than three testing patterns, a socket and testing module. The circuit board includes a routing structure, first contacts and second contacts connected to the routing structure. The three or more than three testing patterns are embedded in the circuit board and electrically connected to the first contacts, where each of the three or more than three testing patterns includes a first conductive line and a second conductive line including a main portion and a branch portion connected to main portion, where the first conductive line and the branch portion are connected to the second conductive line at a merged point of the main portion. The socket is located on the circuit board and includes first connectors electrically connected to the first contacts and second connectors electrically connected to second contacts. The testing module is electrically connected to the circuit board and includes a controller, where the circuit board is located between the socket and the testing module. The first connectors of the socket are configured to transmit testing signals generated from the controller of the testing module to the semiconductor package, and some of the second connectors are configured to transmit respective signal from the semiconductor package to the testing module.

In accordance with some embodiments, a testing method for a semiconductor package includes the following steps, providing a testing apparatus comprising a circuit board having a testing region and comprising a plurality of testing contacts and a plurality of signal contacts distributed in the testing region, a plurality of testing patterns embedded in the circuit board and electrically connected to the testing contacts and a socket located on the circuit board and comprising connectors electrically connected to the circuit board, wherein each of the testing patterns comprises a first conductive line and a second conductive line comprising a main portion and a branch portion connected to main portion, and the first conductive line is connected to the second conductive line at a merged edge; placing the semiconductor package into the testing apparatus, the semiconductor package comprising a semiconductor die, a redistribution circuit structure comprising a signal routing structure electrically connected to the semiconductor die and a ground plate, a plurality of first terminals electrically connected to the ground plate of the redistribution circuit structure and a plurality of second terminals electrically connected to the semiconductor die through the signal routing structure, wherein the connectors of the socket are electrically connected to the first and second terminals of the semiconductor package; and performing an automated test sequence on the semiconductor package through the testing apparatus.

The foregoing outlines features of several embodiments so that those skilled in the art may better understand the aspects of the disclosure. Those skilled in the art should appreciate that they may readily use the disclosure as a basis for designing or modifying other processes and structures for carrying out the same purposes and/or achieving the same advantages of the embodiments introduced herein. Those skilled in the art should also realize that such equivalent constructions do not depart from the spirit and scope of the disclosure, and that they may make various changes, substitutions, and alterations herein without departing from the spirit and scope of the disclosure.

What is claimed is:

1. A testing apparatus for a semiconductor package, comprising:

testing patterns, embedded in a circuit board and electrically coupled to the semiconductor package, wherein each of the testing patterns comprises:

a first conductive line; and a second conductive line, comprising a main portion and a branch portion connected to the main portion, wherein the first conductive line is connected to the second conductive line; and a testing module, disposed over the circuit board, electrically coupled to the testing patterns, and comprising a controller generating the electric signals for testing the semiconductor package.

2. The testing apparatus of claim 1, wherein the first conductive line and the second conductive line is disposed at a same layer.

3. The testing apparatus of claim 1, wherein in each of the testing patterns, the first conductive line is connected to the second conductive line at a merged portion, and a distance between the merged portion and a respective one testing contact is less than or substantially equal to 2.0 cm.

4. The testing apparatus of claim 1, wherein the circuit board has a testing region and comprises a plurality of testing contacts electrically connected to the testing patterns, wherein a spacing distance between two adjacent testing contacts of the plurality of testing contacts is greater than or substantially equal to 1.0 cm.

5. The testing apparatus of claim 1, wherein the circuit board has a testing region and comprises a plurality of testing contacts distributed in the testing region and electrically connected to the testing patterns, wherein one of the plurality of testing contacts is disposed at a center of the testing region.

6. The testing apparatus of claim 5, wherein some of the plurality of testing contacts are disposed at different locations on a diagonal line of the testing region passing through the center.

7. The testing apparatus of claim 6, wherein the different locations are at least positioning in the diagonal line at two opposite sides of the center.

8. The testing apparatus of claim 5, wherein some of the plurality of testing contacts are disposed at different locations on a first diagonal line and a second diagonal line of the testing region intersected at the center.

9. The testing apparatus of claim 8, wherein the different locations are at least positioning in the first diagonal line at two opposite sides of the center and the second diagonal line at two opposite sides of the center.

10. The testing apparatus of claim 1, wherein the plurality of testing contacts are arranged in a symmetric manner along a central line of the testing region.

11. The testing apparatus of claim 1, wherein the testing patterns comprises three or more than three testing patterns.

12. The testing apparatus of claim 1, further comprising:

a socket, disposed on the circuit board and comprising connectors electrically connected to the circuit board, wherein the connectors are configured to transmit electric signals for testing the semiconductor package from the testing apparatus, wherein the circuit board is disposed between the testing module and socket and electrically connected to the plurality of conductive contacts.

13. A testing apparatus for a semiconductor package, comprising:

a plurality of testing patterns, embedded in a circuit board, wherein each of the plurality of testing patterns comprises:

a first conductive line; and a second conductive line, comprising a main portion and a branch portion connected to the main portion, wherein the first conductive line and the branch portion are connected to the second conductive line at a merged point of the main portion; and a socket, disposed over and electrically coupled to the plurality of testing patterns, wherein through the socket, a testing signal generated from the controller of the testing module is transmitted to the semiconductor package and a respective signal from the semiconductor package is transmitted to the testing module.

14. The testing apparatus of claim 13, wherein the circuit board comprises a plurality of testing contacts, and the plurality of testing patterns are electrically coupled to the plurality of testing contacts, wherein the testing apparatus further comprises:

a testing module, electrically coupled to the plurality of testing contacts comprised in the circuit board, and comprising a controller generating the electric signals for testing the semiconductor package; and a socket, comprising a plurality of connectors in contact with the plurality of testing contacts comprised in the circuit board, wherein the connectors are configured to transmit electric signals for testing the semiconductor package from the control, wherein the circuit board is disposed between the testing module and the socket.

15. The testing apparatus of claim 14, further comprising:

a holding device, disposed over the circuit board and penetrating through the socket and the circuit board to secure the socket onto the circuit board.

16. The testing apparatus of claim 15, wherein the holding device comprises a plurality of blots and a plurality of fasteners.

17. A testing method for a semiconductor package, comprising:

providing a testing apparatus comprising a plurality of testing patterns embedded in a circuit board and electrically coupled to the semiconductor package and a testing module disposed over the circuit board, electrically coupled to the testing patterns and comprising a controller generating the electric signals for testing the semiconductor package, wherein each of the testing patterns comprises a first conductive line and a second conductive line, comprising a main portion and a branch portion connected to the main portion, wherein the first conductive line is connected to the second conductive line;

placing the semiconductor package onto the testing apparatus, the semiconductor package comprising a plurality of terminals in contact with the testing apparatus for, through the testing patterns, transmitting a testing signal generated from the controller of the testing module to the semiconductor package and a respective signal from the semiconductor package is transmitted to the testing module; and performing an automated test sequence on the semiconductor package through the testing apparatus.

18. The testing method of claim 17, wherein performing the automated test sequence on the semiconductor package through the testing apparatus comprises:

sending a first current from the testing apparatus to the semiconductor package through the first conductive lines of the testing patterns and measuring, by the testing apparatus, a first initial voltage at merged edges of which the first conductive lines of the testing patterns being connected to the second conductive lines of the testing patterns;

obtaining, by the testing apparatus, a first responsive voltage;

sending a second current from the testing apparatus to the semiconductor package through the first conductive lines of the testing patterns and measuring, by the testing apparatus, a second initial voltage at the merged edges, wherein the first current is different from the second current;

obtaining, by the testing apparatus, a second responsive voltage; and determining a connection status between the plurality of terminals of the semiconductor package and the testing apparatus.

19. The testing method of claim 18, wherein obtaining the first responsive voltage comprises obtaining a reference voltage directly provided by the controller.

20. The testing method of claim 18, wherein obtaining the second responsive voltage comprises obtaining a reference voltage directly provided by the controller.

* * * * *